US012713921B2

(12) United States Patent
Lam et al.

(10) Patent No.: US 12,713,921 B2
(45) Date of Patent: Aug. 18, 2026

(54) COLD PLATE COOLING FOR WAFER-SCALE INTEGRATION WITH BACK SIDE MODULAR POWER DELIVERY

(71) Applicant: Volantis Semiconductor, Inc., Portland, OR (US)

(72) Inventors: Kevin Nan Lam, Pleasanton, CA (US); Tapabrata Ghosh, Oakland, CA (US)

(73) Assignee: Volantis Semiconductor, Inc., Portland, OR (US)

( * ) Notice: Subject to any disclaimer, the term of this patent is extended or adjusted under 35 U.S.C. 154(b) by 88 days.

(21) Appl. No.: 18/958,107

(22) Filed: Nov. 25, 2024

(65) Prior Publication Data

US 2026/0123427 A1 Apr. 30, 2026

Related U.S. Application Data

(63) Continuation-in-part of application No. 18/940,944, filed on Nov. 8, 2024.

(60) Provisional application No. 63/720,216, filed on Nov. 14, 2024, provisional application No. 63/714,353, filed on Oct. 31, 2024.

(51) Int. Cl.

| | |
|---|---|
| ***H10W 40/77*** | (2026.01) |
| ***H10W 40/22*** | (2026.01) |
| ***H10W 40/25*** | (2026.01) |
| ***H10W 40/60*** | (2026.01) |
| ***H10W 70/63*** | (2026.01) |

(52) U.S. Cl.

CPC ....... *H10W 40/776* (2026.01); *H10W 40/228* (2026.01); *H10W 40/258* (2026.01); *H10W 40/611* (2026.01); *H10W 70/635* (2026.01); *H10W 40/60* (2026.01)

(58) Field of Classification Search

CPC ... H10W 40/776; H10W 40/70; H10W 40/73; H10W 40/80; H10W 40/40; H10W 40/47; H10W 40/20; H05K 7/20; H05K 7/20218; H05K 7/2029; H05K 7/20345

USPC ........................................ 257/712, 713, 714

See application file for complete search history.

(56) References Cited

U.S. PATENT DOCUMENTS

| | | | | |
|---|---|---|---|---|
| 9,886,193 | B2 | 2/2018 | Berger et al. | |
| 10,332,931 | B2 | 6/2019 | Cassidy et al. | |
| 10,613,754 | B2 | 4/2020 | Berger et al. | |
| 11,328,208 | B2 | 5/2022 | Lie et al. | |
| 12,089,368 | B2 * | 9/2024 | Bean, Jr. | H05K 7/20272 |
| 12,255,122 | B1 * | 3/2025 | Salmon | H10W 40/47 |
| 12,495,515 | B2 * | 12/2025 | Kang | F28F 3/12 |
| 2020/0258838 | A1 | 8/2020 | Ghosh | |

* cited by examiner

*Primary Examiner* — Hai L Nguyen
(74) *Attorney, Agent, or Firm* — Adams Intellex, PLC

(57) ABSTRACT

Techniques for cooling are disclosed. A wafer-scale silicon interposer (WSSI) is accessed. A front side of the WSSI is bonded to a plurality of functional chips. The chips create heat during operation. The WSSI includes a plurality of through-silicon vias (TSVs). A back side of the WSSI is coupled to a plurality of DC-to-DC power converters. A cold plate is attached to the chips. The cold plate comprises an inlet plate, a jet-plate, and a fin-plate. A coolant at a first temperature is sent into at least one inlet plate inlet nozzle. The sending includes spraying the coolant on the fin-plate. At least a portion of the heat that was created, by the cold plate, is transferred to the coolant. The coolant is captured, at a second temperature, from one or more outlet chambers within the jet-plate.

30 Claims, 17 Drawing Sheets

COLD PLATE COOLING FOR WAFER-SCALE INTEGRATION WITH BACK SIDE MODULAR POWER DELIVERY

RELATED APPLICATIONS

This application claims the benefit of U.S. provisional patent applications "Cooling for Wafer-Scale Integration With Back Side Power Coupling" Ser. No. 63/714,353, filed Oct. 31, 2024 and "Back Side Wafer-Scale Power Delivery With An Anisotropic Film" Ser. No. 63/720,216, filed Nov. 14, 2024.

This application is also a continuation-in-part of U.S. patent application "Back Side Wafer-Scale Integration With Modular Power Delivery", Ser. No. 18/940,944, filed Nov. 8, 2024.

Each of the foregoing applications is hereby incorporated by reference in its entirety.

FIELD OF ART

This application relates generally to cooling and more particularly to cold plate cooling for back side wafer-scale integration with modular power delivery.

BACKGROUND

Temperature is a fundamental property of physical matter. In fact, temperature plays an essential role in a wide variety of scientific, engineering, and everyday applications. Temperature influences a wide range of phenomena, ranging from actions of atoms and molecules to performance of large-scale systems such as skyscrapers and moon rockets. Temperature can determine the state of a substance. The state of the substance can include a solid state, a liquid state, or a gaseous state. We experience these material states daily in common events and activities. The substance states can include fog or frost on our windshields; clouds in the sky which produce precipitation such as rain, sleet, or snow; and liquid for making coffee or tea. Temperature directly influences the density of materials, such as affecting buoyancy and fluid flow. Multiple states of a material can be present simultaneously, such as icebergs floating on ocean surfaces and melting in the sun, returning liquid water to the sea and vapor into the air.

Temperature directly impacts a wide range of reactions such as the rate of some chemical reactions. At room temperature, an egg white and yolk are stable and fluid. If heat is applied to the egg, however, the proteins within the egg start to bond with one another and begin to solidify the egg. The more heat that is applied, the faster the proteins can bond. Temperature affects biological processes as well, including processes associated with flora and fauna. Plant growth, animal activity, and microbial behaviors are all highly influenced by ambient temperatures.

Temperature can impact digital circuits, comprised of transistors, as well. As temperatures rise, carrier mobility within the semiconductor material also increases. This can result in additional active current as more charge flows at the same voltage. Temperature can also impact leakage current of a transistor (the current that flows in a transistor even when a threshold voltage is not applied at the gate). As temperature increases, the leakage current can dominate the current flowing through the transistor, leading to increased power consumption. This effect can be more pronounced in some chips across a wafer as manufacturing specifications can be normally distributed. As a result, some chips can have thinner oxide, narrower gates, etc., which can effectively lower threshold voltage, further increasing leakage current as temperatures rise.

In short, nearly every aspect of life on earth, and every material in our environment, are affected by temperature. Understanding the importance of temperature and its effects can allow us to better control and manage our lives here on earth by developing better techniques for improved management of temperature.

SUMMARY

Businesses operators, researchers, scientists, and consumers have clamored for computers and consumer devices that are faster and have greater capabilities than prior generations of similar devices. In order to meet these market pressures, circuit designers have striven to design and fabricate integrated circuits with ever-increasing processing performance, expanded data processing options, and "product differentiating" features. The latter now commonly include larger touch screens, higher resolution cameras, spatial audio, and biometric sensing, among many others. However, increasing processing speed and capability by introducing advanced parallel processing architectures, or including neural processors, necessitates the addition of significant circuitry to the chips. To add new circuitry into chips, designers have two main options: increasing the chip dimensions by making it larger or increasing circuit density by reducing feature sizes. Ideally, the chip would be the size of an entire wafer, and the feature sizes would include reduced wire widths and separation, smaller transistor sizes, minimum contact sizes, and reductions of any other dimension related to circuity.

In response to never-ending demands for increased performance, engineers have continued to place more transistors on a chip. As a result, microprocessors, accelerators, system-on-chips (SoCs), and so on currently can boast transistor counts into the tens of billions. Commensurate with increasing performance, these improvements and added devices increase the power density of the chips. As a result, keeping transistor junction temperatures at a nominal operational level has become a challenge. This problem is particularly acute for artificial intelligence (AI) accelerators, which can be added to cards and racks in a data center. Liquid cooling technology has become necessary in order to keep these chips cool enough to operate at the high performance demanded by applications while avoiding chip heat-induced failure.

Disclosed techniques enable cooling for wafer-scale integration with back side modular power delivery. A wafer-scale silicon interposer (WSSI) is accessed. A front side of the WSSI is bonded to a plurality of functional chips which create heat. The back side of the WSSI is coupled to a plurality of DC-to-DC power converters. The WSSI includes a plurality of through-silicon vias (TSVs). Power is delivered from the DC-to-DC power converters to the functional chips by the TSVs. A cold plate is attached to the functional chips. The cold plate comprises an inlet plate, a jet-plate, and a fin-plate. A coolant at a first temperature is sent into an inlet nozzle. The coolant is sprayed, by the jet-plate, on the fin-plate. A portion of the heat is transferred by the cold plate to the coolant. The coolant at a second temperature is captured from one or more outlet chambers.

A method for cooling is disclosed comprising: accessing a wafer-scale silicon interposer (WSSI), wherein a front side of the WSSI is bonded to a plurality of functional chips, wherein the plurality of functional chips creates heat during operation, wherein a back side of the WSSI is coupled to a plurality of DC-to-DC power converters, wherein the WSSI includes a plurality of through-silicon vias (TSVs), and wherein power is delivered from the plurality of the DC-to-DC power converters to the plurality of functional chips by the plurality of TSVs; attaching a cold plate to the plurality of functional chips, wherein the cold plate comprises an inlet plate, a jet-plate, and a fin-plate; sending a coolant at a first temperature into at least one inlet nozzle located on the inlet plate, wherein the sending includes spraying the coolant, by the jet-plate, on the fin-plate; transferring at least a portion of the heat that was created, by the cold plate, to the coolant that was sent; and capturing the coolant, at a second temperature, from one or more outlet chambers within the jet-plate.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
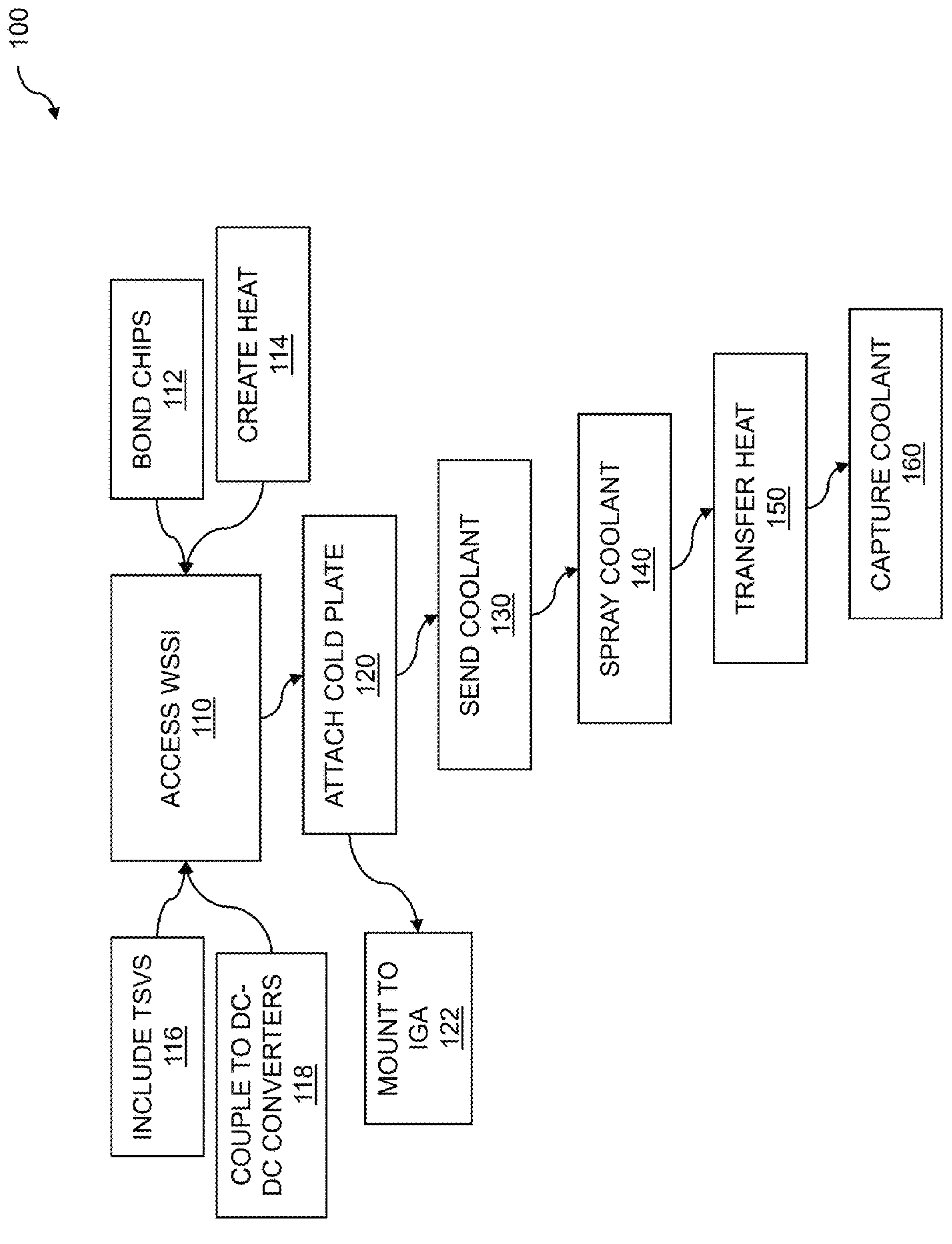
FIG. 1 is a flow diagram for cold plate cooling for wafer-scale integration with back side modular power delivery.

Techniques using cooling for wafer-scale integration with modular back side power coupling are disclosed. As new applications for processors, accelerators, and so on have been developed, correlating demand for processing performance has skyrocketed. This demand is placing great pressure on designers to develop next generation chips that can power computers, servers, cloud servers, LLM engines, etc. To meet these demands, additional transistors have been added to chips such as systems-on-chip (SOCs) which can include processors, memory, I/O circuits, and other elements. These SOCs can be large, encompassing tens of billions of transistors. At the same time, the feature sizes of the transistors used for these large chips continue to shrink. In fact, according to Moore's law, the number of transistors that can fit into the same size chip should double every two years. While at some point, this may end as the limits of lithography and physics are approached, in general, the "law" has held true. While keeping chip sizes roughly the same size is good news, new technologies that drive smaller transistors also impose new challenges on designers. For example, as a transistor shrinks, leakage currents can increase, driving larger power consumption for the chip. This effect, in combination with the active power required for billions of transistors, can drive extremely high power densities for processors and other computing elements.

The immense increase of interest in and use of artificial intelligence (AI) applications, such as large neural networks, transformers, and so on, can require hundreds or even thousands of processing elements. These processing elements can include processor cores, multiprocessor cores, matrix accelerators, SOCs, and so on. While multiple cores such as processor cores and memory cores can be included on the same chip, many chips are required for executing these computationally intensive applications. The processing chips can be in communication locally and remotely. The processing chips are typically coupled via cards, racks, and data centers. Cooling of all these chips has become a highly complex challenge, especially when thermal design power (TDP), a measurement of the maximum power consumed by a chip under normal operating conditions, continues to increase. Traditional methods of cooling have proven woefully insufficient for such applications.

The cooling problem is further exacerbated by new technologies that are being developed to improve performance of AI applications and models. For example, wafer-scale integration is an approach that holds promise to address the performance requirements, and especially the data transfer bandwidth needs, of AI and other applications. Wafer-scale integration can include using a wafer as an interposer to couple many functional chips. The chips can include AI accelerators; processors; SOCs; application-specific integrated circuits (ASICS); memory chips such as SDRAM, DDR1, DDR2, DDR3, DDR4, DDR5 and HBM; and so on. The functional chips can be coupled by wiring paths within the wafer interposer. The wafer interposer can be processed using a back-end-of-line (BEOL) wafer process which can include any number of metal layers. These metal layers can be used to couple any AI accelerator to any memory controller on the interposer. The wafer metal layers can provide extremely high bandwidth communication between any memory controller and any AI processor on the wafer. While such technology can address the performance challenges associated with extremely high compute and bandwidth applications such as AI acceleration, cooling the chips integrated on the wafer interposer presents a substantial technical challenge.

To address the significant cooling challenges described above, wafer-scale cooling technology is disclosed. A wafer-scale silicon interposer (WSSI) is accessed. A front side of the WSSI is bonded to a plurality of functional chips. The plurality of functional chips create heat during operation. A back side of the WSSI is coupled to a plurality of DC-to-DC power converters. The WSSI includes a plurality of through-silicon vias (TSVs). Power is delivered from the plurality of the DC-to-DC power converters to the plurality of functional chips by the plurality of TSVs. A cold plate is attached to the plurality of functional chips. The cold plate comprises an inlet plate, a jet-plate and a fin-plate. Coolant at a first temperature is sent into at least one inlet nozzle located on the inlet plate. The sending includes spraying the coolant, by the jet-plate, on the fin-plate. At least a portion of the heat that was created is transferred, by the cold plate, to the coolant that was sent. The coolant is captured, at a second temperature, from one or more outlet chambers within the jet-plate.

The fin-plate can comprise a plurality of internal fins. The plurality of internal fins can include one or more structural pillars. In some embodiments, the inlet nozzle within the inlet plate is orthogonal to a heat extraction plane within the fin-plate. In one or more embodiments, the spraying occurs at a location on the fin-plate corresponding to each functional chip within the plurality of functional chips. In some embodiments, the spraying occurs at a location on the fin-plate corresponding to each functional chip within the plurality of functional chips. In embodiments, the spraying is accomplished by a plurality of holes in the jet-plate, wherein a diameter of a first hole within the plurality of holes at a first distance from the center of the jet-plate is a different size than a second hole within the plurality of holes at a second distance from the center of the jet-plate.

FIG. 1 is a flow diagram for cold plate cooling for wafer-scale integration with back side modular power delivery. The flow 100 includes accessing a wafer-scale silicon interposer (WSSI) 110. Wafer-scale integration has been a long-sought goal of integrated circuit design. Wafer-scale integration would enable use of an entire wafer such as a silicon wafer on which one large integrated circuit could be fabricated. However, since physical defects in the silicon wafer are distributed across the wafer, portions of circuitry which were fabricated over the defects would likely not function properly. In addition, errors that occur when fabricating the many layers that form the integrated circuit further create portions of the integrated circuit that would likely not function. Instead, by attaching a plurality of integrated circuits to the WSSI, wafer-scale integration can be achieved. In this case, the wafer can be used as an interposer to couple the integrated circuits. The wafer can be a 300 mm wafer, a 200 mm wafer, or a wafer of another size. The wafer can comprise silicon or another suitable material. The wafer can include any amount of front-end-of-line (FEOL) processing and/or back-end-of line (BEOL) processing. The processing can be based on Complementary Metal-Oxide-Semiconductor (CMOS), Silicon on Insulator (SOI), or another process.

In the flow 100, a front side of the WSSI is bonded to a plurality of functional chips 112. The WSSI can have a front side and a back side onto which elements such as the functional circuit elements can be attached or bonded. The functional chips can include general purpose chips such as processor chips, multiprocessor chips, graphics processor chips, application-specific integrated circuits (ASICS), memory chips, and so on. In embodiments, the plurality of functional chips includes one or more artificial intelligence accelerators. In embodiments, the plurality of functional chips includes one or more memory devices. In the flow 100, the plurality of functional chips creates heat 114 during operation. Note that the functional chips can require significant amounts of current during operation. The current can be associated with precharging one or more circuits; transitions of inputs and outputs of logic circuits to voltages that represent a logic one or a logic zero; and so on. The heating can result from IR drops. The heating can occur due to active current, overcurrent, leakage current, and so on.

In the flow 100, the WSSI includes a plurality of through-silicon vias (TSVs) 116. A TSV can include an electrical connection that completely passes through a wafer such as a silicon wafer, a glass wafer, a die, and so on. The plurality of TSVs is oriented vertically in order to enable connections between the front side of the wafer and the back side of the wafer. Chips such as the functional chips can be positioned such that connections to the chips align with the TSVs. In some examples, a wafer can be ground to enable TSV processing with repeatable shapes and parasitic characteristics. In the flow 100, a back side of the WSSI is coupled to a plurality of DC-to-DC power converters 118. The DC-to-DC converters can convert DC power from a high voltage range to a low voltage range (e.g., buck conversion). In a usage example, the DC-to-DC converters can convert DC power from a high voltage range, such as 48 volts to 54 volts, to a lower voltage range, such as 12 volts to 13.5 volts. The higher voltage range can be a voltage range normally supplied to racks within a data center. In a usage example, power can be delivered from the plurality of the DC-to-DC power converters to the plurality of functional chips using the plurality of TSVs. The delivering can include a second voltage conversion. The second voltage conversion can change the voltage that the functional chips receive to an appropriate operating level, such as less than 1 volt. The delivering can be based on a plurality of modular substrates that can be bonded to the back side of the WSSI. Chips such as the functional chips can be positioned such that connections to the chips align with the TSVs. In some examples, a wafer can be ground to enable TSV processing with repeatable shapes and parasitic characteristics.

The flow 100 includes attaching a cold plate 120 to the plurality of functional chips. The cold plate can be used to remove at least a portion of the heat generated by the functional chips while the chips are operating. The attaching the cold plate to the functional chips can be accomplished using screws, bolts, clips, fasteners, and so on. The cold plate can include one or more elements. In embodiments, the cold plate comprises an inlet plate, a jet-plate, and a fin-plate. Each of the plates can serve an integral role in the operation of the cold plate. The inlet plate can include a nozzle for receiving a liquid such as a coolant. The jet-plate can form a spray from the coolant received by the inlet plate. The jet-plate can direct the coolant spray onto the fin-plate. In embodiments, the fin-plate comprises a plurality of internal fins. The internal fins, as discussed below and throughout, can increase the surface area of the fin-plate. The increased surface area of the fin-plate can better transfer heat generated by the functional chips to the coolant, thereby extracting more heat from the functional chips. In embodiments, the attaching the cold plate includes a thermal interface material (TIM). The TIM can conduct heat between surfaces, thus enabling more efficient cooling solutions. The TIM can comprise thermal tape, grease, gel, adhesive, phase change materials (PCMs), metal TIMs, pyrolytic graphite, and so on. In a usage example, the TIM can include an uncured TIM. The uncured TIM can remain flexible or viscous, thereby enabling the cold plate and the functional chips to expand by different lateral displacements based on different coefficients of thermal expansion.

The flow 100 further includes mounting the cold plate to an isometric grid array (IGA) 122. The IGA can provide stiffening for the WSSI. The WSSI, which is comprised of silicon, can be fragile. As mentioned previously, the WSSI can be ground to a small dimension or thickness in order to accommodate a plurality of TSVs. The grinding can make the WSSI more fragile because of the reduced thickness of the wafer. The IGA can provide support for the WSSI. This support of the WSSI can be important to avoid cracking as components, such as the cold plate, are coupled. The IGA can comprise a grid. The back side of the WSSI can be inserted into the IGA. The back side of the WSSI can remain accessible via a plurality of open recesses within the IGA. The cold plate can then be screwed to the IGA, thus pressing the cold plate to the functional chips on the front side of the WSSI. Other fastening techniques can be used to mount the cold plate to the isometric grid array. In embodiments, the mounting is based on one or more spring-loaded fasteners. In this way, the IGA can also enable coplanarity for the WSSI. Discussed previously, the cold plate can comprise an inlet plate, a jet-plate, and a fin-plate. In embodiments, the inlet plate, the jet-plate, and the fin-plate are comprised of copper.

The flow 100 includes sending a coolant 130 at a first temperature into at least one inlet nozzle located on the inlet plate. The nozzle can be used by the cold plate to accept a coolant. The nozzle can be coupled to a pump or another system which provides the coolant for the cold plate. The first temperature can be any temperature. The first temperature can be high enough to prevent the coolant from freezing, and low enough to transfer heat from the one or more functional chips. The first temperature can be below the normal operating temperature of the functional chips. The coolant can be distilled water or another liquid. The coolant can be mixed with additives such as glycol. The first temperature can be achieved by chilling the coolant. The coolant can be chilled by a refrigeration loop, a heat exchanger, and so on. These chilling elements can be separate from the cold plate. In the flow 100, the sending includes spraying the coolant 140, by the jet-plate, on the fin-plate. The inlet plate can be coupled to the jet-plate so that the coolant, after being received by the nozzle, can be sent to the jet-plate. The pressure from the coolant being sent to the nozzle can force the coolant through one or more holes in the jet-plate. The jet-plate can be coupled to the fin-plate. In embodiments, the spraying occurs at a location on the fin-plate corresponding to each functional chip within the plurality of functional chips. Recall that the functional chips can be attached to the cold plate. The attaching can occur at the exterior bottom of the fin-plate. Since each functional chip can be a source of heat, the spraying can be tuned to be located at each heat source within the interior of the fin-plate. The number of holes in the jet-plate can be less than, equal to, or greater than the number of functional chips. The spraying can occur at a location on the fin-plate corresponding to a center of each functional chip.

The flow 100 includes transferring at least a portion of the heat 150 that was created, by the cold plate, to the coolant that was sent. The coolant that was sprayed on the fin-plate can come into contact with the bottom of the fin-plate. Discussed above, the fin-plate is attached to the functional chips. Thus, heat can be transferred, by the fin-plate, from the functional chips to the coolant. In embodiments, the fin-plate comprises a plurality of internal fins. The internal fins can increase the surface area of the fin-plate, thus further distributing the heat generated by the functional chips. The internal fins, by increasing the surface area of the fin-plate, can transfer a larger portion of the heat created by the functional chips to the coolant. The internal fins can include one or more materials. In embodiments, the internal fins can be comprised of copper. The internal fins can comprise any height, such as 8-mm, 10-mm, and so on. When the coolant is sprayed from the jet-plate to the fin-plate, the coolant from the various sprays can mix and come into contact with the fins. The fins can conduct heat from the bottom of the fin-plate away from the functional chips on the exterior of the fin-plate. Thus, the bottom of the fin-plate can comprise a heat extraction plane. The fins can be coupled to the heat extraction plane. The coolant can come into contact with the fins and with the heat extraction plane. In embodiments, the inlet nozzle within the inlet plate is orthogonal to a heat extraction plane within the fin-plate. This orthogonality can enable separation of power (from the back) and cooling (from the front) when the WSSI is used in a rack, a data center, and so on.

The spraying by the jet-plate can be accomplished by a plurality of holes in the jet-plate. A diameter of a first hole within the plurality of holes at a first distance from the center of the jet-plate can be a different size than a second hole within the plurality of holes at a second distance from the center of the jet-plate. Because the coolant can mix within the fin-plate, the functional chips near the center of the bottom of the fin-plate can receive a colder coolant temperature than chips that are near the edge of the bottom of the fin-plate. To offset this disparity, holes in the jet-plate can be larger toward the edges as compared to the holes in the center. Thus, more coolant can be sent to a location on the fin-plate corresponding to a location of edge chips on the WSSI. The holes at a first distance from the center of the jet-plate can be larger or smaller than the holes at a second distance from the center of the jet-plate. The first distance can be farther or closer to the center of the jet-plate than the second distance. Thus, any combination of smaller and larger holes can be used.

In embodiments, the plurality of internal fins includes one or more structural pillars. The structural pillars can connect the interior of the jet-plate to the interior of the fin-plate. The structural pillars can set a height between the jet-plate and the fin-plate. In further embodiments, the structural pillars provide rigidity between the jet-plate and the fin-plate, wherein the structural pillars include mechanical connections between the jet-plate and the fin-plate. The rigidity can protect the WSSI from flexing, thereby protecting the fragile WSSI from cracking, warping, or breaking. The one or more structural pillars can include one or more materials. In some embodiments, the one or more structural pillars are comprised of copper. Similar structural pillars can be added between the inlet plate and the jet-plate to provide mechanical integrity and/or rigidity.

The flow 100 includes capturing the coolant 160, at a second temperature, from one or more outlet chambers within the jet-plate. The one or more outlet chambers can direct the coolant at the second temperature to an outlet nozzle associated with the jet-plate. The second temperature can be higher than the first temperature. In some embodiments, a height of each internal fin within the plurality of internal fins provides a gap to a top of the jet-plate from a bottom of the fin-plate. The gap can be any measurement, such as 0.9 mm, 1 mm, and so on. With the plurality of fins in place, the gap can allow the coolant to mix and to exit the cold plate. The coolant can exit the cold plate at one or more outlet chambers within the jet-plate. The coolant that is captured at the second temperature can be chilled. The chilling can be accomplished using a refrigerant loop, a heat exchanger, and so on. These elements can be separate from the cold plate. The chilling of the coolant at the second temperature can include chilling the coolant to the first temperature. The coolant at the first temperature can be sent into at least one inlet nozzle located on the inlet plate.

Various steps in the flow 100 may be changed in order, repeated, omitted, or the like without departing from the disclosed concepts. Various embodiments of the flow 100 can be included in a computer program product embodied in a non-transitory computer readable medium that includes code executable by one or more processors.

Figure 2:
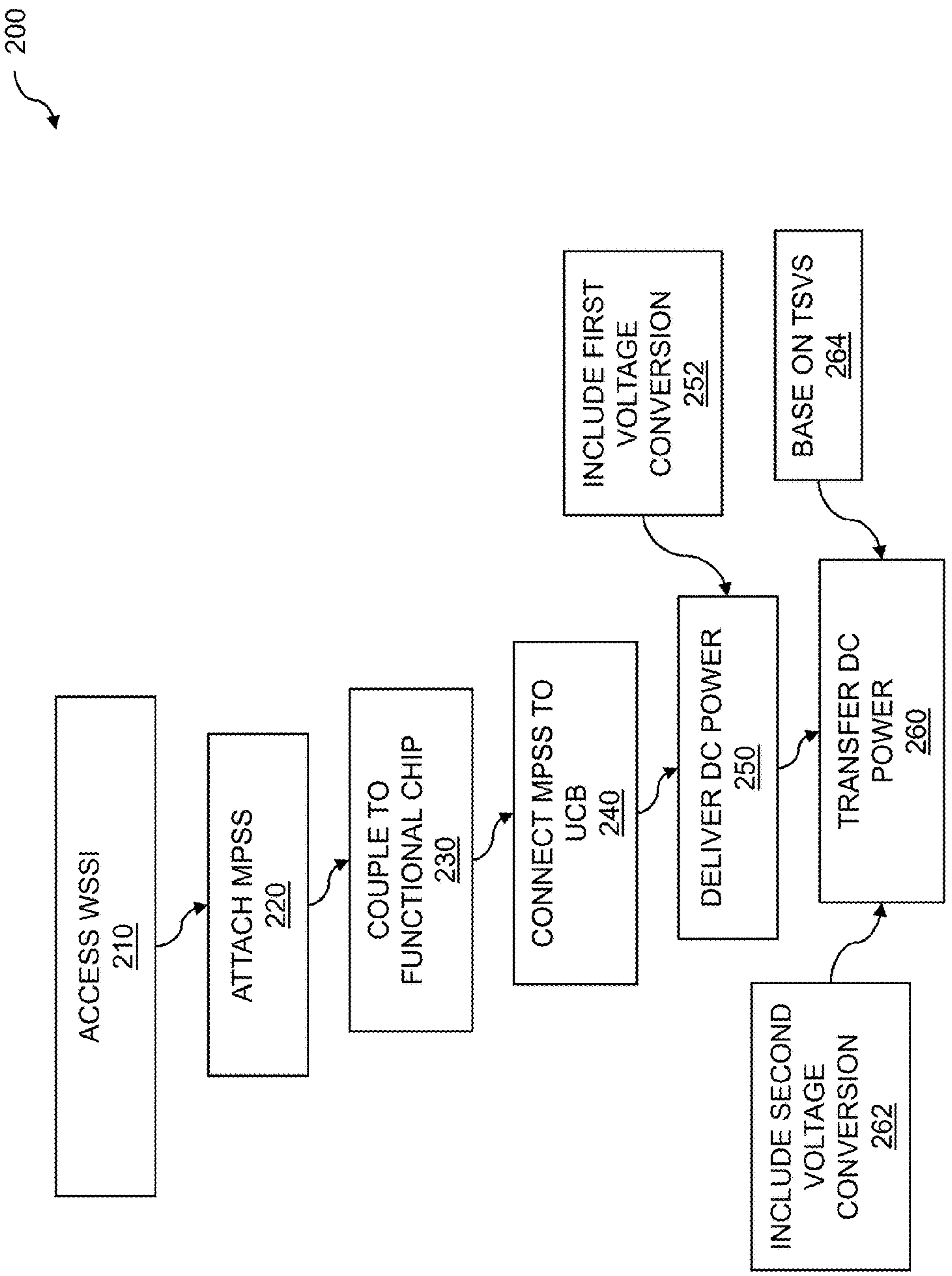
FIG. 2 is a flow diagram for transferring DC power.

FIG. 2 is a flow diagram for providing DC power. Chips such as functional chips can be bonded to a wafer-scale silicon interposer (WSSI). The use of the WSSI supports wafer-scale integration (WSI), which is particularly useful to supporting the processing requirements of computationally intensive applications such as artificial intelligence (AI) acceleration. The functional chips that execute the computationally intensive applications require significant amounts of power during operation. The power, which includes DC power, must be provided the functional chips. The power can be provided using modular power delivery techniques. As the functional chips are operating, prodigious amounts of excess heat can be generated by the functional chips. At least a portion of the generated heat can be transferred to a coolant that can be sent to a cold plate. Thus, providing DC power enables a cold plate for back side wafer-scale integration with modular power delivery.

The flow 200 includes accessing a wafer-scale silicon interposer (WSSI) 210. A wafer, such as a silicon or glass wafer, can be used as an interposer. The interposer can be bonded to a plurality of integrated circuits such as functional chips. The interposer can be used to achieve wafer-scale integration. Wafer-scale integration has been a long-sought goal of integrated circuit design. Wafer-scale integration, once achieved, would enable use of an entire wafer such as a silicon wafer on which one large integrated circuit could be fabricated. However, since physical defects in the silicon wafer are distributed across the wafer, portions of circuitry fabricated over the defects will most likely not function properly. In addition, errors that occur when fabricating the many layers that form the integrated circuit further create portions of the integrated circuit that will likely not function. Instead, by attaching a plurality of integrated circuits to the WSSI, wafer-scale integration can be achieved.

The wafer can include a 300 mm wafer, a 200 mm wafer, or a wafer of another size. The wafer can comprise silicon or another suitable material such as glass. The wafer can include any amount of front-end-of-line (FEOL) processing and/or back-end-of line (BEOL) processing. The processing can be based on Complementary Metal-Oxide-Semiconductor (CMOS), Silicon on Insulator (SOI), or another process. A front side of the WSSI can be bonded to a plurality of functional chips. The WSSI can have a front side and a back side onto which elements such as the functional circuit elements can be attached. The functional chips can include general purpose chips such as processor chips, multiprocessor chips, application-specific integrated circuits (ASICS), memory chips, and so on. The functional chips can further include specialty processing chips such as accelerators for artificial intelligence training and inferencing, machine learning, and the like. The WSSI includes a plurality of through-silicon vias (TSVs). A TSV can include an electrical connection that completely passes through the front side and the back side a wafer such as a silicon wafer or a die. The plurality of TSVs is oriented vertically in order to enable connections between the front side of the wafer and the back side of the wafer. Chips such as the functional chips can be positioned such that connections to the chips align with the TSVs. In some examples, a wafer can be ground to enable TSV processing with repeatable shapes and parasitic characteristics.

The flow 200 includes attaching 220, to a back side of the WSSI, a plurality of modular power substrates (MPSs). A modular power substrate can include one or more electrical elements, connectors, and so on. In embodiments, the attaching is based on one or more controlled collapse chip connection bumps (C4s). In the C4 technique, solder balls are placed on connections or pads at the topmost layer of the functional chips. The chips are flipped using a flip-chip technique so that the C4 bumps align with the TSVs discussed previously. The electrical elements can include DC-to-DC converters. Any number of voltage conversions can be included so that the functional chips receive power at an appropriate voltage for operation. In a usage example, the first voltage conversion is accomplished by the plurality of DC-to-DC power converters. The connectors can include a high power connector and a plurality of rigid-flex strips. The substrate associated with an MPS to which are mounted the electrical elements, connectors, and so on can include a variety of materials. In a usage example, one or more MPSs within the plurality of MPSs can include an organic substrate. An organic substrate can be based on organic materials such as organic materials used to manufacture printed circuit boards. The organic substrate materials can include paper cores impregnated with phenolic resin; woven or unwoven glass cloth impregnated with epoxy or cyanate ester, among others; natural fibers; etc. In another usage example, one or more MPSs within the plurality of MPSs can include an inorganic substrate. An inorganic substrate can be based on silicon, glass, etc. In the flow 200, each MPS is coupled to one or more functional chips 230 within the plurality of functional chips. The coupling between the each MPS and the one or more functional chips can be accomplished using the TSVs.

The plurality of MPSs can be based on a form factor mirroring one or more corresponding functional chips, within the plurality of functional chips, on the front side of the WSSI. The form factor can include a square form factor, a rectangular form factor, and so on. In a usage example, the form factor of the MPS is smaller than the form factor of the WSSI. The flow 200 further includes connecting mechanically 240 the plurality of MPSs, to a unified control board (UCB), wherein the UCB includes the plurality of DC-to-DC power converters. In some examples, the UCB can comprise one or more control boards. Each control board can include the plurality of DC-to-DC power converters. The connecting mechanically can be accomplished using plug-and-socket connectors, terminals, cables, and so on. In a usage example, the connecting mechanically an MPS to the UCB can be accomplished using a DC power connector and a plurality of rigid-flex strips. The connecting mechanically can be based on a high voltage socket. The UCB can include one or more digital controller chips to control the DC-to-DC power converters. The digital control circuits can comprise a processor, a multiprocessor, a microcontroller, and so on. The digital control circuits can control the DC-to-DC power converters.

The connecting mechanically accommodates a maximum lateral displacement of the UCB due to thermal expansion during operation. Physical components such as substrates, WSSIs, etc. can expand when heated based on a coefficient of thermal expansion associated with each material. A coefficient of thermal expansion of the UCB can be different from a coefficient of thermal expansion of the WSSI. The difference in expansion coefficients can cause connectors to disconnect, C4s to crack, materials to experience physical strain and subsequent damage, etc. Thus, if the UCB is directly mechanically connected to a WSSI, the lateral displacement due to differences in thermal expansion can cause mechanical failure. Recall that the MPSs can be modular and based on a form factor mirroring one or more corresponding functional chips on the front side of the WSSI. The modularity of the MPSs can provide a flexible power delivery system to the functional chips which can accommodate different movements of the WSSI and UCB due to thermal expansion. For example, an MPS at one side of the WSSI can be decoupled from an MPS on the other side of the WSSI, thus accommodating various movements across the WSSI and UCB. Recall also that the MPSs can be mechanically connected to the UCB via a high-power socket, which can couple the DC-to-DC converters within the UCB to the MPSs. The high-power socket can provide flexibility to accommodate lateral movement between the UCB and the MPS (which is attached to the WSSI). Further, recall that the mechanical connection can include one or more rigid-flex strips, which can couple power control signals, power, and the like on the UCB to the MPSs. The flexibility of the rigid-flex strips can further accommodate lateral movement between the UCB and MPS. These mechanical connections can provide flexibility to accommodate local expansion. These factors can allow the MPSs to provide “flex” between the UCB and WSSI as they expand at different rates.

The flow 200 further includes delivering DC power 250, by the UCB, to the plurality of MPSs. The delivering DC power can be accomplished by the plurality of DC-to-DC converters included on the UCB. The delivering DC power can include delivering DC power to a subset of MPSs. The delivering DC power can be accomplished by matching one or more DC-to-DC converters to one or more MPSs. Interconnection between the DC-to-DC converters matched with one or more respective MPSs can be accomplished using interconnect associated with the UCB. The DC power that is delivered can include a range for the DC voltage. The range of DC voltage can include a percentage of a target voltage, an allowable operating range of DC voltage, and the like. In a usage example, the voltage range can include 48 volts to 54 volts, inclusive. In the flow 200, the delivering includes a first voltage conversion 252. The first voltage conversion can include a DC-to-DC voltage conversion. The result of the DC-to-DC voltage conversion can include a DC voltage higher than the input DC voltage or a DC voltage lower than the input DC voltage. The first voltage conversion can be accomplished using the one or more DC-to-DC converters. The DC-to-DC converters can include a plurality of DC-to-DC converters connected to the UCB.

The flow 200 further includes transferring the DC power 260 that was delivered, by the plurality of MPSs, to the plurality of functional chips. The one or more functional chips can obtain the transferred power using interconnect, contacts, and so on. The functional chips can also use interconnect and contacts to receive and send data, instructions, control signals, etc. In the flow 200, the transferring includes a second voltage conversion 262. The second voltage conversion can be accomplished using one or more converters such as DC-to-DC converters associated with the MPSs. The second voltage conversion can produce a voltage that can be used directly to operate one or more functional chips. The second voltage conversion can attain a voltage less than the voltage resulting from the first voltage conversion. The second voltage conversion can result in a voltage less than a threshold. The threshold can include a target voltage, an operating voltage, and so on. In a usage example, the threshold is 1 volt. In the flow 200, the transferring is based on the plurality of TSVs 264. The transferring can include transferring DC power, receiving and sending data, sending and receiving functional chip instructions and control signals, etc.

Various steps in the flow 200 may be changed in order, repeated, omitted, or the like without departing from the disclosed concepts. Various embodiments of the flow 200 can be included in a computer program product embodied in a non-transitory computer readable medium that includes code executable by one or more processors.

Figure 3:
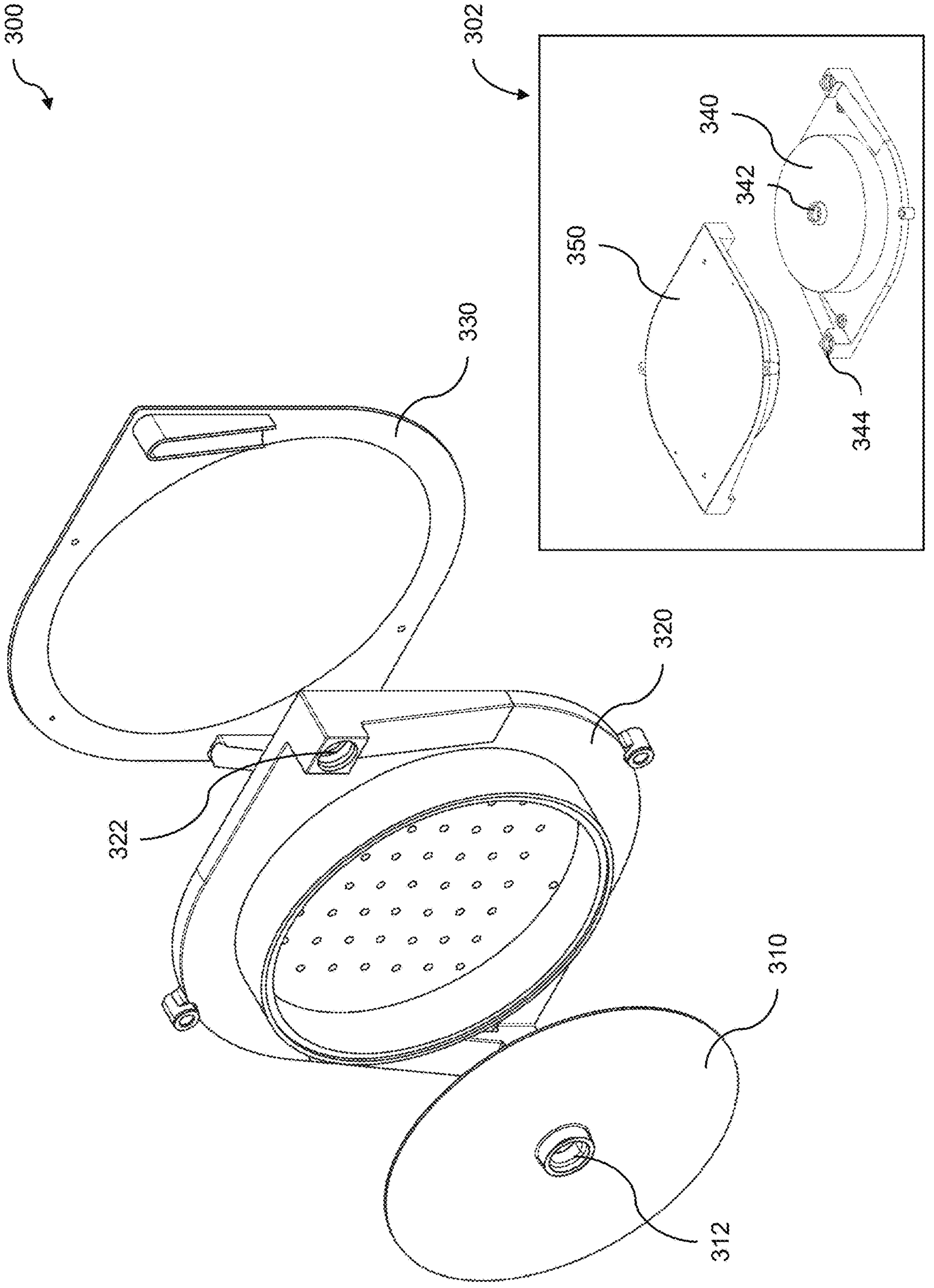
FIG. 3 is a diagram for a cold plate.

FIG. 3 is a diagram for a cold plate. Integrated circuits or chips can generate prodigious heat when operating. In order to remove at least a portion of the excess heat that is generated by the chips, a cold plate can be used to promote cooling of a plurality of functional chips. The functional chips can be bonded to a front side of a wafer-scale silicon interposer (WSSI). The functional chips can include substantially similar chips or a variety of chips. The functional chips can include general purpose chips such as processor chips, multiprocessor chips, application-specific integrated circuits (ASICS), system-on-chips (SoCs), and so on. In embodiments, the plurality of functional chips includes one or more artificial intelligence accelerators. In embodiments, the plurality of functional chips includes one or more memory devices. The plurality of functional chips creates heat during operation due to current flow, where the current flow can include active current, overcurrent, leakage current, and so on. The excess heat generated by the functional chips must be removed from the chips because if left unchecked, the excess heat can accumulate in the chips and can cause functional failure of the chips. The excess heat can be removed, at least in part, by a cold plate that can be attached to the plurality of functional chips. The cold plate comprises an inlet plate, a jet-plate, and a fin-plate. The cold plate can comprise a range of materials. In embodiments, the inlet plate, the jet-plate, and the fin-plate are comprised of copper. The cold plate enables cooling for back side wafer-scale integration with modular power delivery.

The diagram 300 shows an expanded view of a cold plate. The cold plate can be used to extract at least a portion of heat generated by one or more functional chips. The diagram 300 includes an inlet plate 310. The inlet plate can provide access to receive a liquid such as a coolant. The coolant can include a variety of liquids such as distilled water, environmental water, deionized water, liquid mixtures such as glycol/water liquid mixtures, dielectric fluids, and so on. The inlet plate can include one or more inlet nozzles 312. The one or more inlet nozzles can be configured to receive a coolant at a first temperature. The first temperature can be different from the temperature of the functional chips such as a temperature less than or below the normal operating temperature of the functional chips. The coolant can be chilled prior to application of the coolant to the cold plate. The coolant can be pumped into the inlet nozzle. The pumping of the coolant can ensure a sufficient flow of liquid into the cold plate to enable removal of at least a portion of the heat generated by the functional chips. The pump can send the coolant into the nozzle at a pressure sufficient to overcome any back pressure associated with the cold plate. In embodiments, the inlet nozzle within the inlet plate is orthogonal to a heat extraction plane within the fin-plate (discussed below).

The diagram 300 includes a jet-plate 320. The jet-plate can be coupled to the inlet plate described above. The coupling can enable the coolant that is sent to the inlet plate to be sent, from the inlet nozzle on the inlet plate, to the jet-plate. The jet-plate can include a plurality of holes. The holes can be arranged in various configurations on the jet-plate. The holes can be arranged in a matrix pattern, in a spiral pattern and so on. The holes in the jet-plate can include holes of substantially similar sizes or substantially dissimilar sizes. In a usage example, the holes can be arranged in a matrix pattern. The holes can increase in size moving out from the center of the jet-plate. That is, the smallest holes can be located nearest the center of the jet-plate, while the largest holes can be located toward the periphery of the jet-plate. The holes in the jet-plate can be perpendicular or normal to the plane of the jet-plate, or can be at an angle relative to the plane of the jet-plate. The holes in the jet-plate can direct the coolant from the inlet plate to be sprayed onto a fin-plate (described below). In embodiments, the jet-plate includes one or more outlet chambers 322, wherein the one or more outlet chambers capture the coolant at a second temperature. The coolant that was sent to the inlet plate and was sprayed onto the jet-plate can increase in temperature as the sprayed coolant transfers at least a portion of the heat from the functional chips. The one or more outlet chambers can allow the coolant to exit the cold plate. The coolant can exit the cold plate after it has removed heat by mixing in the fin-plate. Since the coolant has removed at least a portion of the heat from the fin-plate, it can be at a higher temperature when it exits than when it entered through the inlet nozzle. The coolant can be sent to a heat exchanger and recycled back to the cold plate for additional cooling.

The diagram 300 includes a fin-plate 330. The fin-plate comprises the bottom of the cold plate. The fin-plate can be attached to the plurality of functional chips. The fin-plate can cover an area sufficient to cover a single functional chip or a plurality of functional chips. The spraying by the jet-plate can be directed onto the fin-plate. The spraying can occur at a location on the fin-plate corresponding to each functional chip within the plurality of functional chips. The spraying can occur at a location on the fin-plate corresponding to the center of each functional chip. The number of holes in the jet-plate can be less than, equal to, or more than the number of functional chips. The spraying can occur at a location on the fin-plate corresponding to a center of each functional chip. The fin-plate can include a plurality of fins (not shown; described in FIG. 6 and FIG. 7).

The fin-plate 330 can include a heat extraction plane. The heat extraction plane can include a bottom surface of the fin-plate. Since the bottom of the fin-plate can be attached to the functional chips, the heat extraction from the functional chips can be transferred to the fin-plate. In embodiments, the attaching can include a thermal interface material (TIM). The TIM can include one or more of a thermal pad, thermal tape, thermal grease, thermally conducting films, thermal gap fillers, and so on. The TIM can aid the heat extraction by enhancing the conductivity between the surface of the functional chips and the bottom of the fin-plate. In embodiments, the fin-plate comprises a plurality of internal fins. The fins can be coupled to the bottom of the fin-plate. The fins can include fins of one or more sizes, one or more heights, and so on. The fins can increase the surface area of the fin-plate, thus helping the heat extraction from the functional chips. The coolant that is sprayed from the jet-plate to the fin-plate can come into contact with the fins, further enhancing heat extraction. To facilitate movement of the coolant in and out of the cold plate, the fins can allow for a gap between the top of the fins and the jet-plate. In embodiments, a height of each internal fin within the plurality of internal fins provides a gap to a top of the jet-plate from a bottom of the fin-plate. The gap to the top of the jet-plate can additionally assist with mixing the coolant within the cold plate, further enhancing cooling, and so on. The mixing and the enhanced cooling can be especially useful for heat extraction as some functional chips may be hotter than others. The mixing of the coolant can allow additional coolant to flow to hotter parts of the fin-plate and/or fins to remove additional heat. The jet-plate and the fin-plate can be mechanically connected to maintain a chamber in which the coolant can flow. In embodiments, the plurality of internal fins includes one or more structural pillars. The structural pillars can maintain a reliable gap between the pillars and the jet-plate. In one or more embodiments, the structural pillars provide rigidity between the jet-plate and the fin-plate, wherein the structural pillars include mechanical connections between the jet-plate and the fin-plate. Discussed previously, the constituent elements of the cold plate can include one or more materials. In some embodiments, the one or more structural pillars are comprised of copper.

The diagram 302 includes an example assembled cold plate. The top view of the cold plate is shown 340. The top view shows an inlet nozzle 342. The inlet nozzle shown can include an inlet nozzle from a plurality of inlet nozzles. The inlet nozzle can be used to send coolant into the cold plate. The top view further shows an output chamber 344. The outlet chamber can include an outlet chamber from a plurality of outlet chambers. The one or more outlet chambers can be used to capture the coolant at the second temperature. The diagram 302 further shows a bottom view of the assembled cold plate 350. The bottom of the cold plate can be attached to the one or more functional chips. A TIM (not shown) can be applied to the bottom of the cold plate prior to attaching the cold plate to the one or more functional chips.

Figure 4:
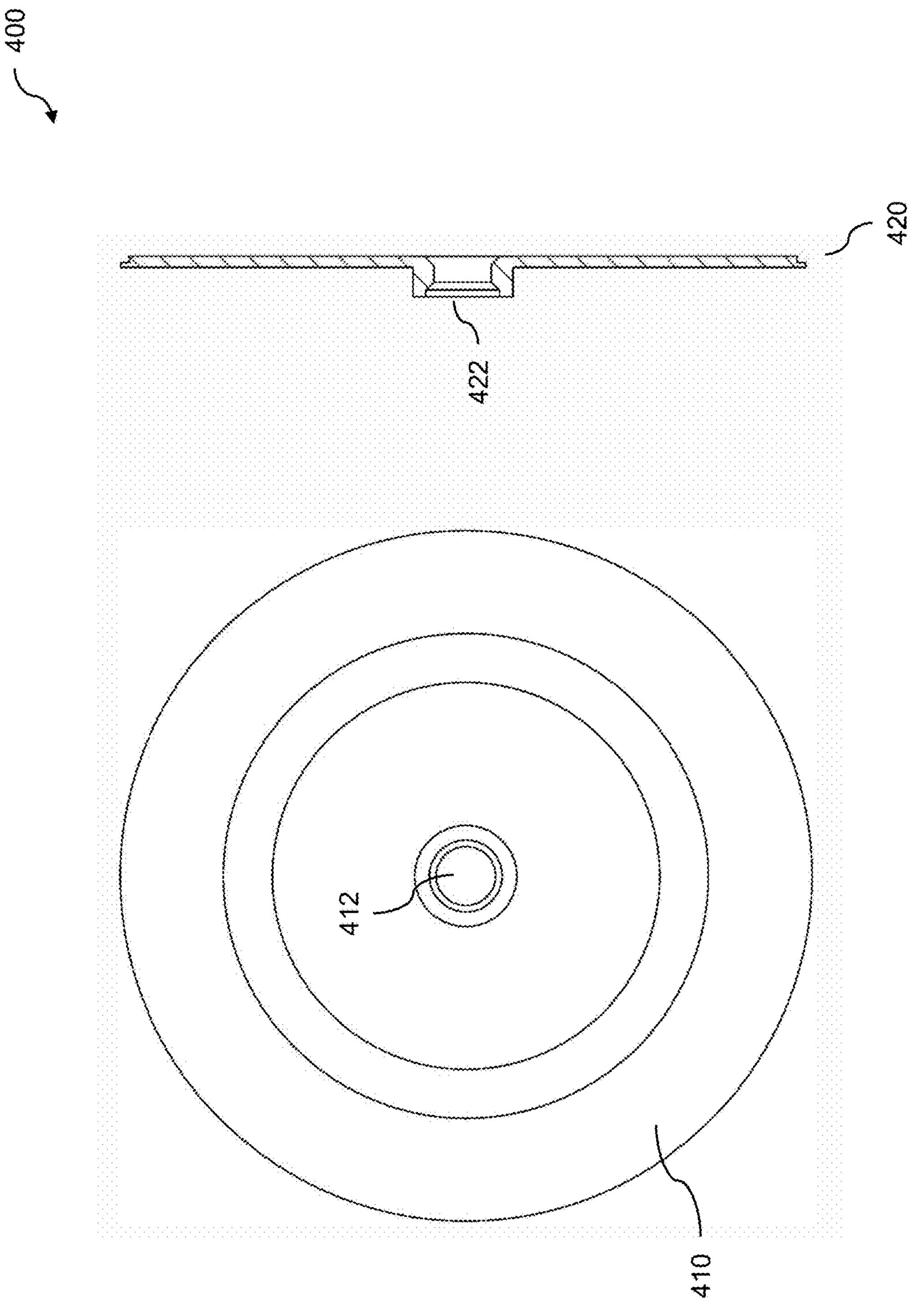
FIG. 4 is a diagram of an inlet plate.

FIG. 4 is a diagram of an inlet plate 400. Described previously and throughout, a cold plate can be used to extract at least a portion of heat generated by one or more functional chips. The functional chips can be bonded to a front side of a wafer-scale silicon interposer (WSSI), where the WSSI can enable wafer-scale integration with modular power delivery. The delivery of power, including delivery of modular power, to a plurality of functional chips can cause the functional chips to generate heat. The heat generation can be attributed to IR heating within the plurality of functional chips. A top view of an inlet plate is shown 410. While the top plate in the diagram is shown to be round, the top plate, and other elements of the cold plate, could have other shapes such as square, rectangular, and so on. The top view of the inlet plate shows an inlet nozzle 412. More than one inlet nozzle can be associated with the top plate. The inlet nozzle can be oriented at an angle with respect to the top plate. The at least one inlet nozzle is located orthogonally to a heat extraction plane. A side view of the inlet plate is also shown 420. The side view of the inlet plate shows that the plate can have a thickness. The thickness of the top plate can be chosen to handle an amount of heat, a fluid pressure such as a fluid pressure associated with a coolant (discussed below) and so on. The side view of the top plate shows the inlet nozzle 422. The inlet nozzle can be configured to receive a coupling such as a press-fitted coupling, a threaded coupling, a crimped coupling, and so on. While one inlet nozzle is shown, more than one inlet nozzle can be associated with the top plate.

Figure 5:
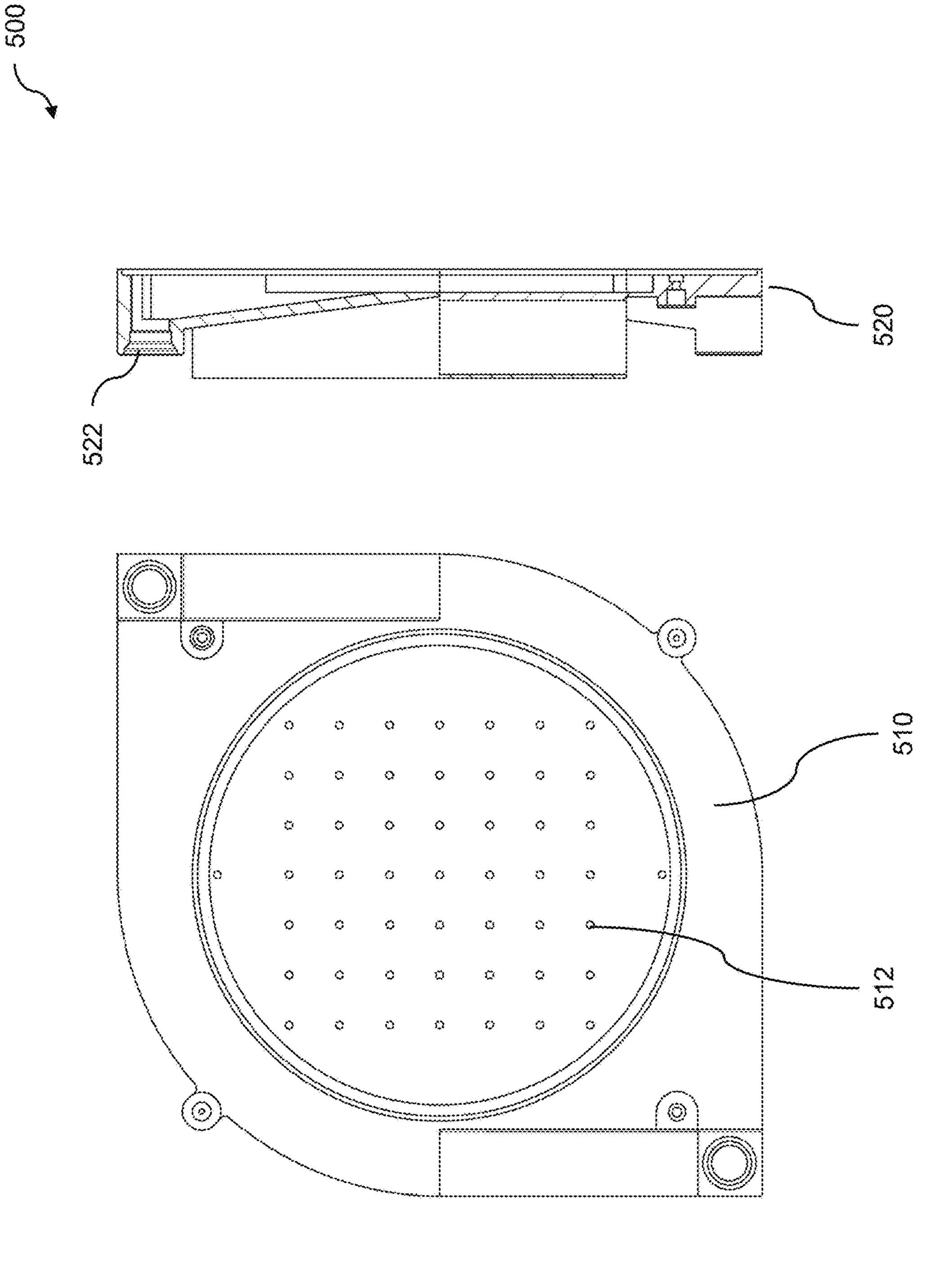
FIG. 5 is a diagram of a jet-plate.

FIG. 5 is a diagram of a jet-plate. The jet-plate, which is an element of a cold plate, can be used to spray a liquid such as a coolant liquid. The coolant is sent at a first temperature into at least one inlet nozzle located on the inlet plate described previously. The sending includes spraying the coolant. The spraying the coolant is accomplished by the jet-plate. The spray that is created by the jet-plate is directed onto a fin-plate (described below). The fin-plate can be used to extract at least a portion of heat from one or more functional chips that are bonded to a wafer-scale silicon interposer (WSSI). The jet-plate enables a cold plate for back side wafer-scale integration with modular power delivery.

The diagram 500 shows a jet-plate 510. The jet-plate can be used to spray a coolant, at a first temperature, such as a coolant liquid onto the fin-plate. The spray can include a mist, a plurality of droplets, a stream or jet, and so on. The spray by the jet-plate can be accomplished by one or more holes 512 in the jet-plate. The holes in the jet-plate can be arranged in a variety of configurations including a matrix or grid configuration, a spiral configuration, and the like. The holes in the jet-plate can include holes of a substantially similar size or holes of differing sizes. The sizes of the holes can be graduated. In a usage example, holes adjacent to a center or midpoint of the jet-plate can include a smaller size relative to holes adjacent to an outer range of the jet-plate that can include a larger size. The differences in hole sizes can be used to handle differing heat profiles across a functional chip, differences in coolant temperature across the jet-plate, etc. The diagram 500 shows a side view of the jet-plate 520. Recall that the coolant that is sprayed by the jet-plate can extract at least a portion of the heat generated by one or more functional chips. The coolant can be captured at a second temperature. The coolant can be captured from the jet-plate using one or more output chambers such as output chamber 522. The coolant at the second temperature can be used implementing a variety of techniques such as a heat exchanger. The heat exchanger can extract the excess heat and return the coolant to the first temperature. The heat exchanger can be separate from the cold plate.

Figure 6:
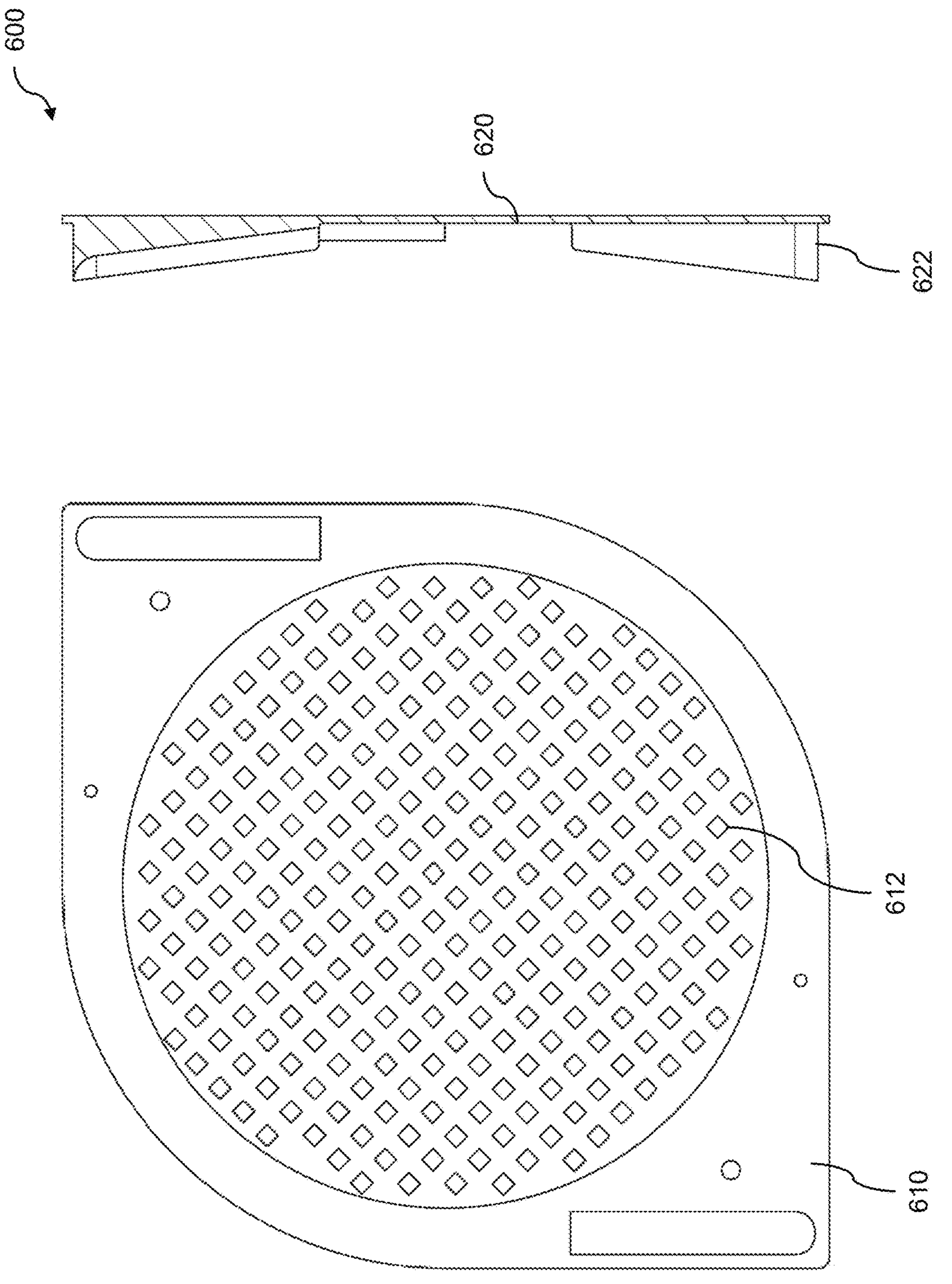
FIG. 6 is a diagram of a fin-plate.

FIG. 6 is a diagram of a fin-plate. The fin-plate 600 is an element of the cold plate. The cold plate can be attached to one or more functional chips associated with a wafer-scale silicon interposer (WSSI). The WSSI can enable back side wafer-scale integration with modular power delivery. The fin-plate can be the closest element associated with the cold plate to be attached to the one or more functional chips. The fin-plate can extract heat generated by the one or more functional chips as the functional chips are executing. The diagram 600 shows a top view of a fin-plate 610. The fin-plate can include one or more structures that can aid in removing heat from the functional chips. In embodiments, the fin-plate comprises a plurality of internal fins. An example internal fin is shown 612. The internal fins can include fins of substantially similar sizes, of substantially dissimilar sizes, and so on. The fins can include a variety of cross-sections and sizes. The fin cross-sections can include square cross sections, round cross-sections, rectangular cross-sections, and so on. In a usage example, fins with square cross-sections can be chosen to maximize a number of fins that can be placed on the fin-plate in order to maximize heat sinking capacity of the fin-plate. In embodiments, the plurality of internal fins includes one or more structural pillars. The structural pillars can provide spacing between the internal fins and the jet-plate described previously. In embodiments, the structural pillars provide rigidity between the jet-plate and the fin-plate, wherein the structural pillars include mechanical connections between the jet-plate and the fin-plate. The mechanical connections can enable coolant flow around and across the internal fins. The diagram 600 shows a side view of the fin-plate 620. The fin-plate can include one or more output chambers such as output chamber 622. The one or more output chambers can be used to extract the coolant at a second temperature, where the second temperature results from the coolant removing heat from the internal fins of the fin-plate.

Figure 7:
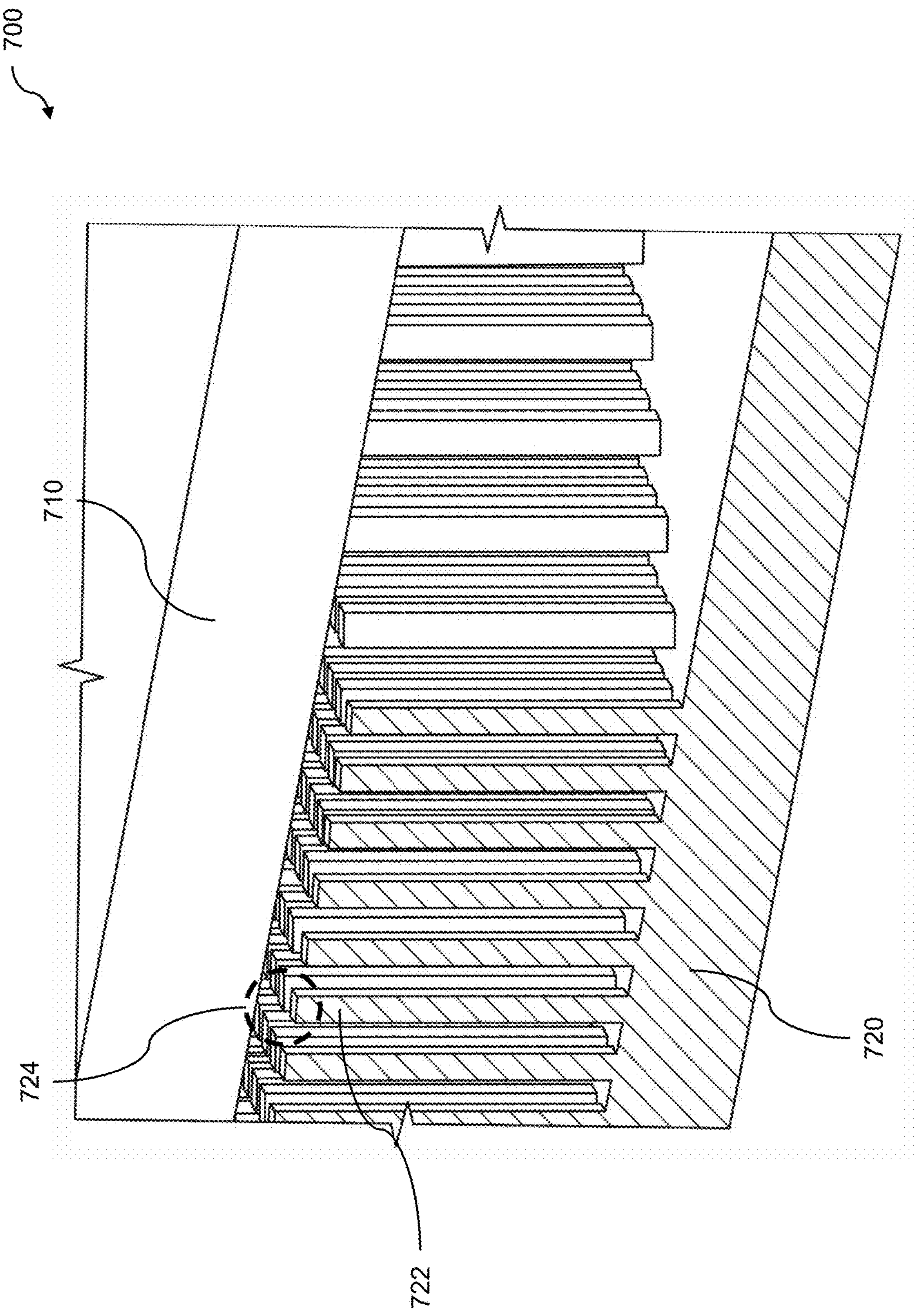
FIG. 7 is a diagram for internal fins within a cold plate.

FIG. 7 is a diagram of internal fins within a cold plate. Functional chips, such as functional chips bonded to a wafer-scale silicon interposer (WSSI), can generate copious amounts of heat while operating. A cold plate can be attached to a plurality of functional chips. Coolant can be sent to the cold plate, where the coolant can be sprayed onto the internal fins within the cold plate. The cold plate can be used to transfer at least a portion of the heat that was created by the functional chips as they operate. The internal fins can transfer more heat from the functional chips bonded to the WSSI to the coolant by increasing cooling surface area within the cold plate. The internal fins within the cold plate enable a cold plate for back side wafer-scale integration with modular power delivery.

The diagram 700 for internal fins within a cold plate includes a jet-plate 710. As described above and throughout, the jet-plate can be used to spray a coolant onto the internal fins associated with the fin-plate. A pressure can be associated with the coolant. The pressure associated with the coolant that can be sent to a nozzle associated with a top-plate of the cold plate can force the coolant through one or more holes in the jet-plate (not shown in FIG. 7). In embodiments, the spraying occurs at a location on the fin-plate corresponding to each functional chip within the plurality of functional chips. The diagram 700 includes a fin-plate 720. The jet-plate can be coupled to the fin-plate via one or more structural pillars. In embodiments, the structural pillars provide rigidity between the jet-plate and the fin-plate, wherein the structural pillars include mechanical connections between the jet-plate and the fin-plate. The structural pillars; the internal fins; the elements of the cold plate including the top plate, the jet-plate, and the fin-plate; and so on, can include one or more materials. The structural fins can be comprised of copper, which can enhance cooling of the functional chips. The height of the structural fins can be determined to set the pressure of the coolant. The pressure of the coolant can be set so that the coolant exits the one or more outlet chambers. The exiting of the coolant via the one or more outlet chambers can enable sufficient coolant flow to achieve the amount of cooling desired. In embodiments, the fin-plate comprises a plurality of internal fins 722. The fins can increase the surface area of the fin-plate, thus enhancing the thermal cooling of the functional chips by the cold plate. The fins can comprise a rectangular shape, a diamond shape, or another shape. The fins can be arranged according to a pitch. The fins can be evenly spaced on the fin-plate. In embodiments, a height of each internal fin within the plurality of internal fins provides a gap 724 to a top of the jet-plate from a bottom of the fin-plate. The gap can allow the coolant to mix within the fin-plate and exit through the one or more outlet chambers with sufficient flow.

Figure 8:
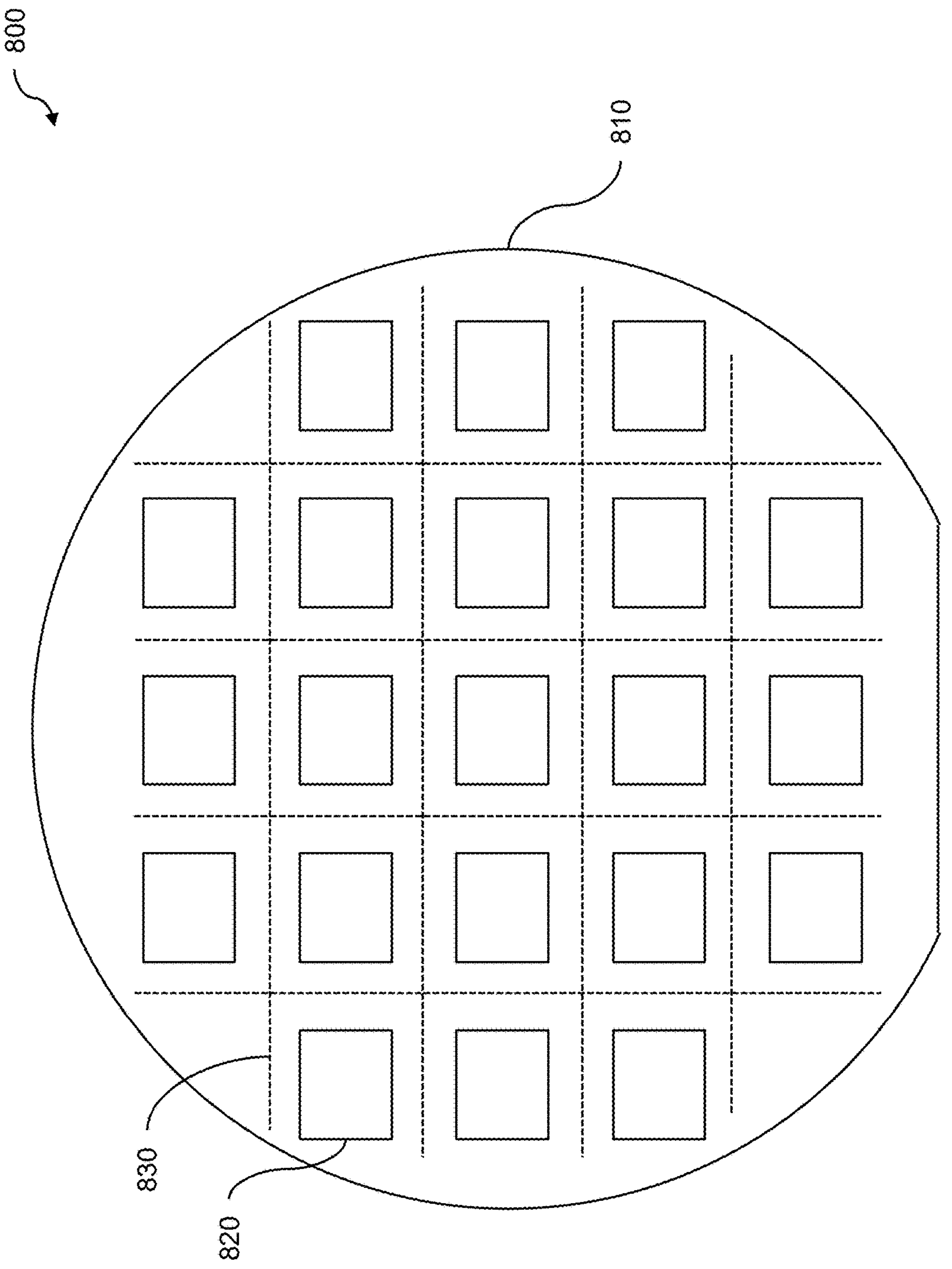
FIG. 8 shows a wafer with multiple die.

FIG. 8 shows a wafer with multiple die. A semiconductor wafer such as a silicon wafer is used in the fabrication of electronic circuits or chips. Other semiconductor materials such as germanium, silicon carbide, indium phosphide, etc. can also be used. The wafers that are used are obtained in various sizes. One common size wafer includes a 300 mm silicon wafer. Integrated circuits or "chips" can be fabricated on the surface of the wafer using techniques that can include diffusion, deposition, and so on. The circuits are called "die" during fabrication. The die can include a plurality of similar circuits or can include two or more different circuits or "projects". The similar circuits and the different projects can include processors, memories, mix-signal chips, and so on. The multiple die that can be fabricated on the semiconductor wafer can include die used to enable back side wafer-scale integration with modular power delivery. A cold plate can enable cooling of the wafer used for wafer-scale integration.

The figure 800 shows a wafer with multiple die. A wafer can be based on a monocrystalline semiconductor material. The semiconductor material can include a group IV material such as silicon, a group III-V material such as gallium arsenide, and so on. The die on the wafer shown are substantially similar in size. However, the die can be substantially different in size. A system can depend on a certain number of functional die. For instance, an artificial accelerator used for training a large neural network can require a large number of functional die which can be AI accelerators. Since a wafer will contain defects randomly distributed across the wafer, some of the die fabricated on the wafer will be affected by the wafer defects and will not function properly. By fabricating multiples of the die, the probability of fabricating at least one functioning chip increases. Further, because presence or absence of circuits or die on the wafer can influence successful fabrication of a given die, a wafer can be "covered" with circuits for fabrication. Because of the shape of the wafer, which is typically round with at least one flat edge to aid alignment, some of the circuits may not be fully contained within the boundaries of the wafer. The resulting "partial" circuits or die will not function fully or at all. In some cases, the partial die may be usable in other applications.

A wafer is shown 810. The wafer can include multiple die such as die 820. The multiple die can be replicas of the same chip. In some cases, the multiple die can be different die, such as SRAM die. The die on the wafer can all be fabricated using the same fabrication technology. If any die requires different fabrication technologies, then that die must be fabricated on a different wafer. While 18 die are shown on wafer 810, in practice any number of die can be present. The number of die will depend on the size of the wafer and the size of the die. When fabrications steps, of which there can be many, are completed, the die can be separated. The figure shows a plurality of dashed lines such as line 830. The dashed lines represent scribe lines or kerf associated with the wafer. A saw, a laser, etc. is used to slice the wafer into liberated, individual die. Since the saw or other cutting device has a finite width, some wafer material is lost due to the width of the saw or cutting device. As a result, any structures such as test structures used to track processing steps during fabrication are lost.

While multiple die are shown in the diagram, the desire to further push the size of individual die has continued at a rapid pace. As one reference point, a packaged processor chip that is larger than 35 mm on a side has become common. However, as die on a wafer become larger, the risk of individual die being impacted by defects in the wafer or defects associated with any of the many fabrication steps increases. How, then, could one produce even larger chips? One suggestion that has long been proposed is to use the "entire" wafer to form a single large chip or "super chip". In addition to producing the one chip on the wafer, packaging could potentially be reduced since the packaging would involve the one chip instead of a typical suite of chips, where each chip requires its own packaging. Wafer scale integration or WSI has been proposed as particularly well suited to applications that demand extensive data processing. Examples proposed that could benefit from WSI have included computer architectures appropriate for massively parallel supercomputers, and computationally intensive applications such as machine learning and deep learning. However, successful fabrication of a single chip across an entire wafer is an extremely difficult undertaking. Noted above, the widespread and random distribution of defects and other variations such as warpage across a wafer render the ability to build one "super-circuit" elusive. Also, circuit redundancy becomes a major design issue. Not only are redundant circuits that can be switched in to replace defective circuits necessary, but the locations of the redundant circuits are also critical. Note that the redundant circuits must be connected in place of the defective circuits, and that wiring on an integrated circuit is extremely expensive in terms of real estate. As a result, the placement of the redundant circuits must be carefully considered to conserve wafer real estate and to reduce wiring complexity.

Figure 9:
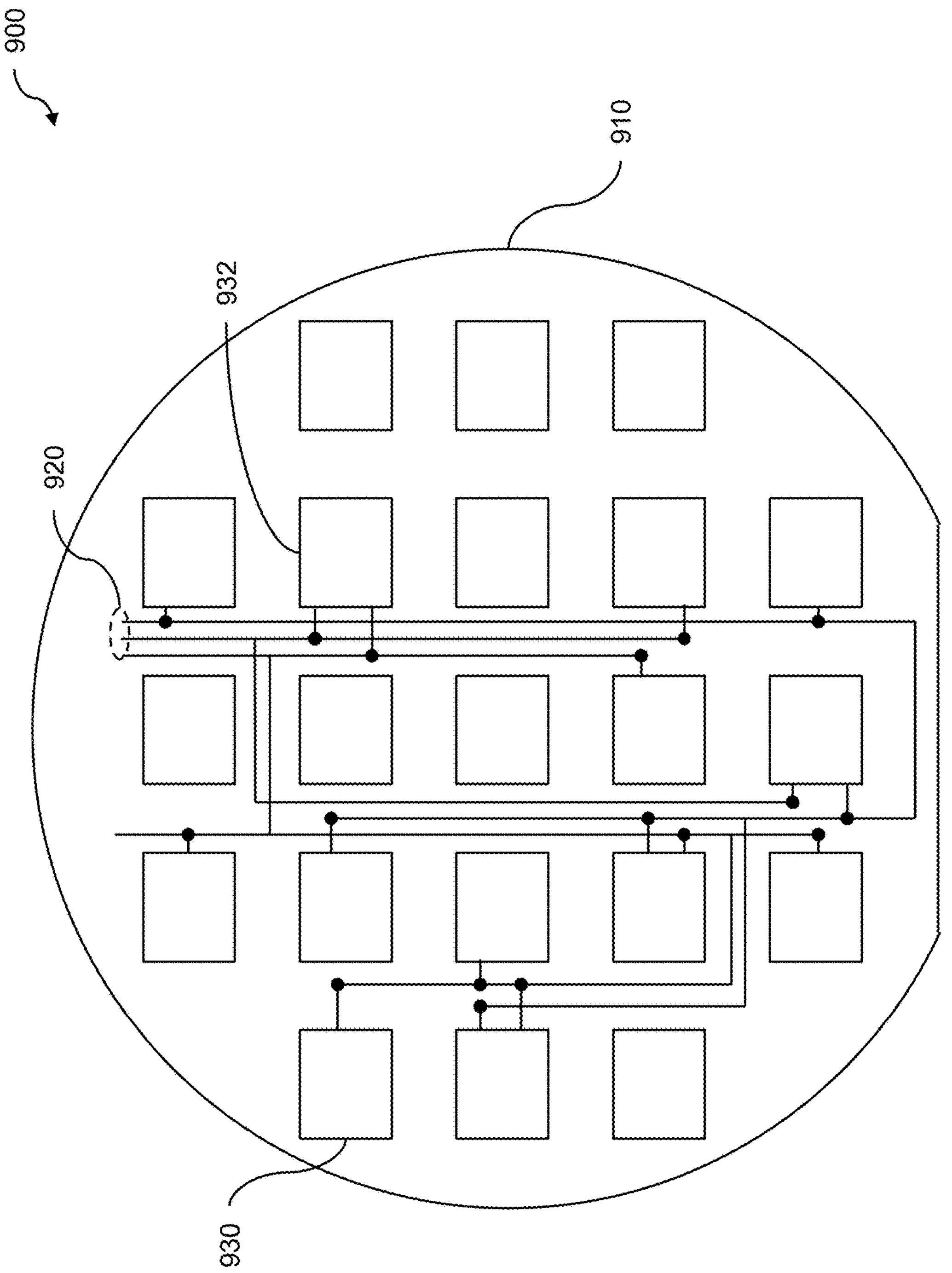
FIG. 9 illustrates inter-die interconnect for wafer-scale integration.

FIG. 9 illustrates inter-die interconnect for wafer-scale integration. Discussed previously and throughout, the demand for larger integrated circuits that can meet increasingly intensive processing demands has been stymied by the difficulty of producing large, single chips. One of the fundamental difficulties of producing a large chip, such as a wafer-sized chip, is that defects are randomly distributed across a wafer on which the large chip would be produced. Further, defects, such as disconnects in wiring, variations in oxide (insulator) thicknesses, open-circuit contacts, varying doping profiles, and so on, can be introduced during the fabrication process. One possible approach to "wafer-scale" integration is to continue to fabricate circuits on the wafer. Then, instead of cutting the wafer to access the individual dies, the wafer remains whole. By adopting an approach such as this one, the kerf, previously lost to the cutting of the wafer into the individual die, can be used for interconnect. Recall that interconnect on a wafer consumes wafer real estate that cannot be used for circuitry. By capturing the real estate previously lost to the kerf, additional wafer real estate that can be used for interconnect is reclaimed. The interconnect in the kerf is particularly appropriate for long-haul connections, such as connections between individual die on the wafer.

The figure 900 illustrates use of wafer real estate, otherwise lost to scribe lines or kerf for inter-die interconnect, for wafer-scale integration. A wafer 910 is shown on which multiple die, or chips, are distributed. The die are fabricated together on the wafer. That is, each of the die on the wafer is fabricated based on the same processing steps. Since the individual die will not be separated from the wafer using a cutting technique, the kerf area of the wafer can be used for interconnect. Other areas of the die can also be used for interconnect. The interconnect 920 can be placed in wiring channels or routes, where the wiring channels are realized in what would formerly have been the kerf. The wiring channels include wafer real estate in which interconnecting wire can be placed. The interconnect can be fabricated while the various die on the wafer are fabricated. The interconnect can include a plurality of wiring layers. The various layers can be interconnected using contacts, vias, and so on. In the figure, a few example interconnecting runs are shown. The various die on the wafer can make connections to the wiring channels. In the figure, die 930 can use the wiring channels to connect to die 932.

Figure 10:
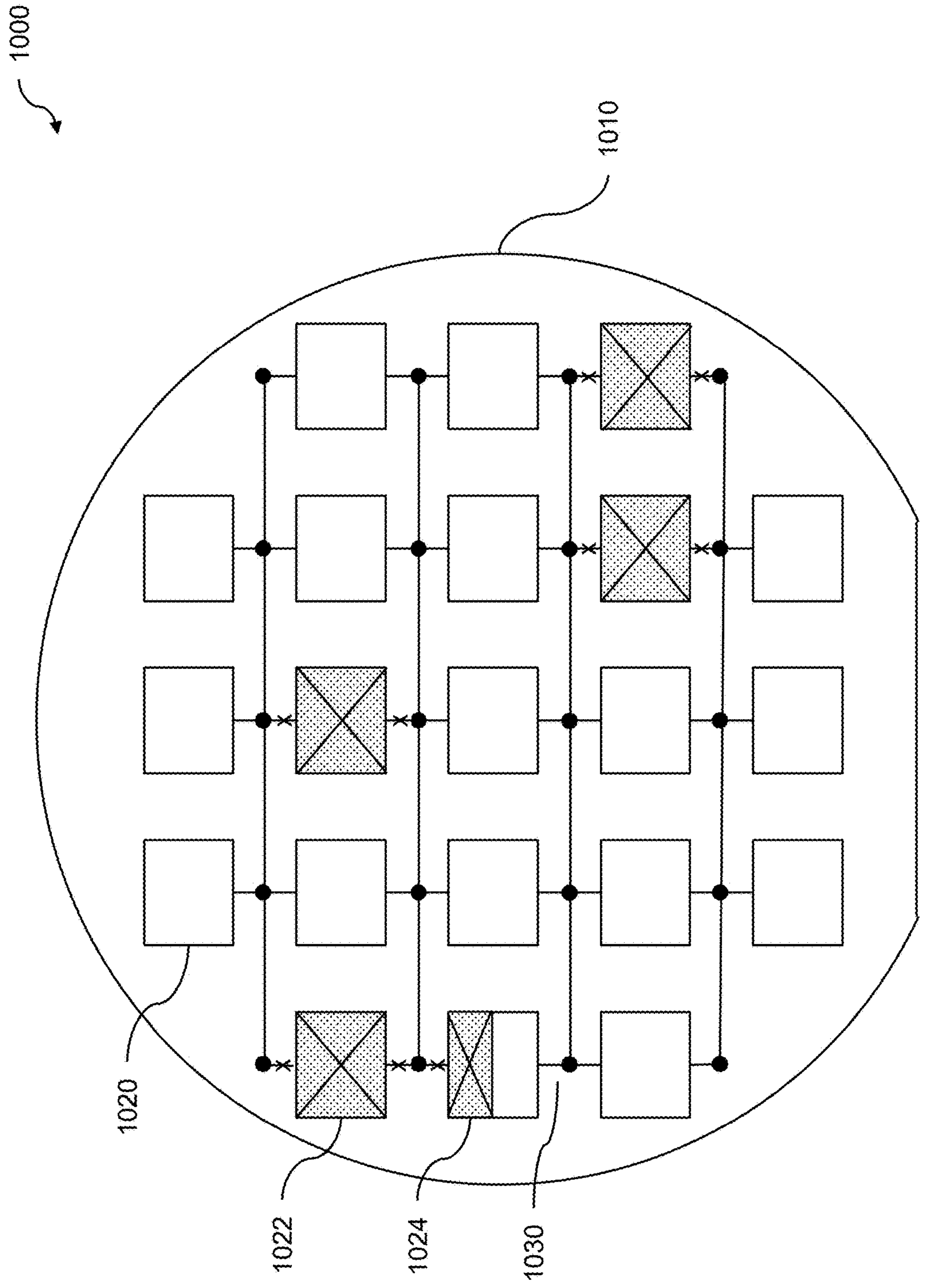
FIG. 10 shows inter-die interconnect and redundancy for wafer-scale integration.

FIG. 10 shows inter-die interconnect and redundancy for wafer-scale integration. Building on the previous discussions of techniques including fabricating redundant die on a wafer and of using the kerf for interconnect, a technique for wafer-scale integration (WSI) can be based on fabricating redundant die on the wafer and selecting the working die for use by a system based on WSI. Working die can be selected while non-working die, partial die, and other substandard die can be electrically ejected from the system by deselecting them. The deselecting can include disabling wired connections to the unused die, physically "blowing" connections to the unused die, and so on. The remaining functioning die can be interconnected using inter-die interconnect to form a system on the wafer. Power can be provided to the die, as can data, control signals, and so on. In embodiments, the power to the die can be provided using modular power delivery techniques. The die can generate copious amounts of heat while operating. In a usage example, a cold plate can be coupled to the die in order to extract a portion of heat from the die.

The figure 1000 shows redundant die and inter-die interconnect. A wafer is shown 1010. The wafer is populated with multiple die 1020. A number of the die shown can be redundant. Some of the redundant die will include defects, can miss specifications, or can otherwise fail. The defects can be associated with the wafer on which the die are fabricated, associated with one or more processing steps for fabricating the die, and so on. This can result in die that are not operational, such as die 1022. Recall that die can be fabricated on the wafer in order to ease some fabrication complexities, and that some of the added die can include partial die such as die 1024. The failed die and the partial die can be excluded from a system formed by wafer-scale integration (WSI). In some cases, a die such as 1024 can be partially functioning. The portion of the die that is functioning can be included in the WSI, while the portion of the die that is not functioning can be excluded. The functioning die can be inter-connected using inter-die interconnect 1030. The inter-die interconnect can include multi-layer interconnect. The inter-die interconnect can be placed between the die associated with the multiple projects. Functioning die can be connected to the inter-die interconnect, while non-functioning die can be disconnected from the inter-die inter-connect.

Figure 11:
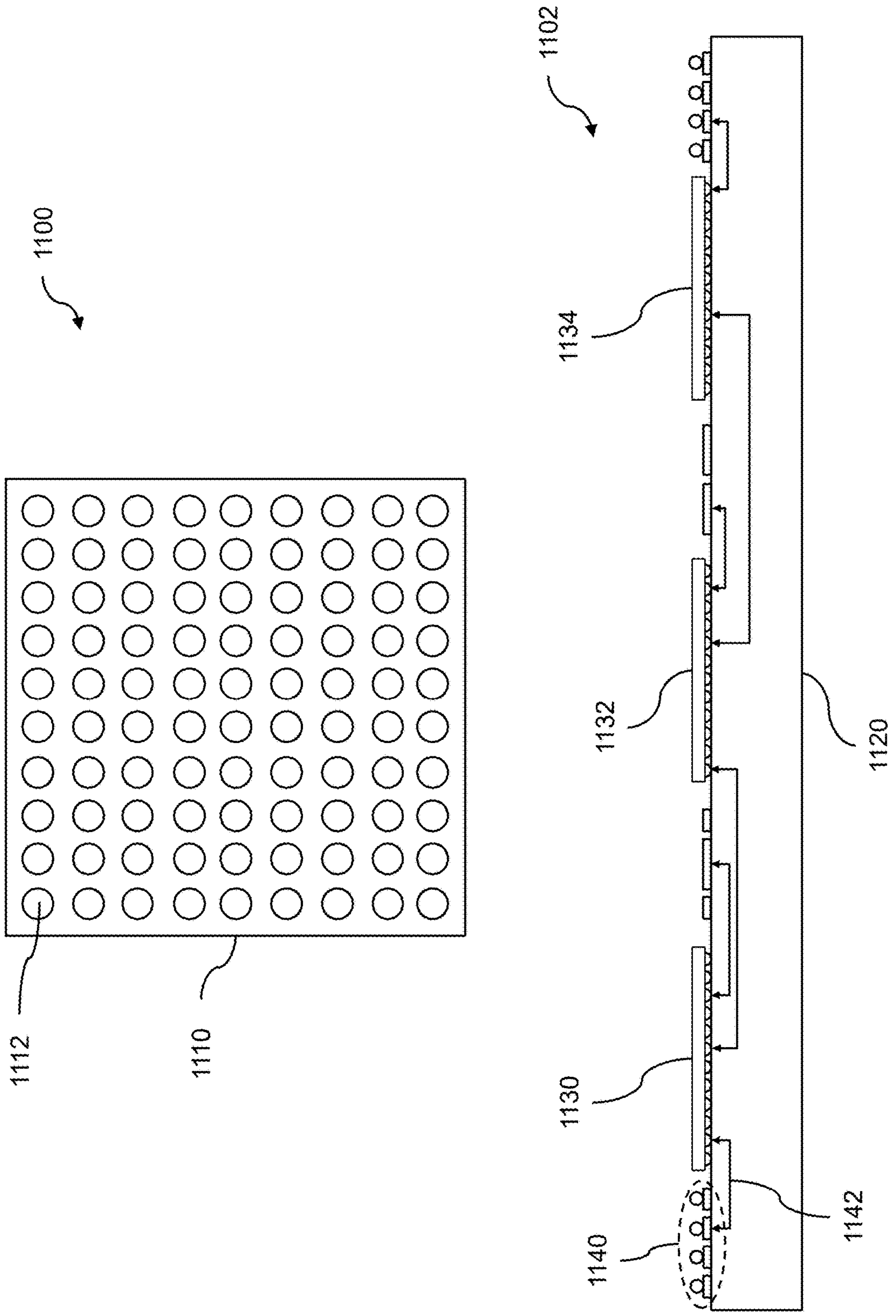
FIG. 11 illustrates an interposer and flip-chips for wafer-scale integration.

FIG. 11 illustrates an interposer and flip-chips for wafer-scale integration. One technique that can be used to approach the benefits of wafer-scale integration is to attach more than one chip to a common substrate or interposer. The substrate can include a wafer, a carrier, a circuit board, and so on. To accomplish such a technique, all interconnections to a circuit or chip, including data connections, control and signal connections, power, and so on, can be made at the top layer of the chip. The connections at the top of the chip replace the traditional placement of pads at the periphery of the chip. To connect the top connections of the chip to the interposer, solder balls are placed on the top connections and the chip is "flipped" or inverted. The solder balls, when melted, can connect the top connections of the chip to corresponding connections or pads on the interposer. Further chips can be similarly flipped and connected to additional corresponding connections on the interposer. The interposer can provide power to the plurality of flip-chips connected to it. The flip-chip technique is supported by power delivery provided by the interposer. Noting that copious heat can be generated by the flipped chips while they are operating, a cooling technique can be used to extract a portion of the generated heat. In a usage example, a cold plate can be coupled to the flipped chips to extract a portion of the heat generated by the operating chips.

The figure 1100 includes an example flip-chip. Discussed previously, the flip-chip 1110 differs from a traditional chip in that the connections to the flip-chip are made at the top of the chip rather than to pads located at the periphery of the chip. The top of a flip-chip is shown. The top can include pads that can be connected to pads corresponding to pads on a multi-chip module, a circuit board, an interposer, and so on. An example contact or pad 1112 is shown. Multiple pads can be distributed across the top of the flip-chip. The pads can be oriented to correspond with receiving pads on the interposer. An array of pads is shown. In a usage example, a subset of pads is required to connect the flip-chip to the interposer. Thus, required pads are present at the top of the flip-chip, while the unused pads can be omitted from the top of the flip-chip.

The figure 1102 illustrates an example interposer. As discussed previously, the interposer 1120 can include a wafer, a carrier, a circuit board, an interposer, and so on. One or more flip-chips can be attached to the interposer. In the figure, the flip-chips can include a first flip-chip 1130, a second flip-chip 1132, a third flip-chip 1134, and so on. While three flip-chips are shown, other numbers of flip-chips can be attached to the interposer. In addition to serving as a landing spot for the flip-chips, the interposer can provide interconnect. The interconnect can be used to provide signals such as control signals, data, and so on the flip-chips. The interconnect can further provide power to the flip-chips. Depending on the interposer used to receive the flip-chips, the interposer can include one or more layers of interconnect. The interconnect can include interconnect at a top surface of the interposer such as top surface interconnect 1140. The interposer can further include additional layers of interconnect. The additional layers of interconnect can be fabricated on the interposer. The additional layers of interconnect can be isolated from each other using an insulating layer between the conducting interconnect layers. An example "lower layer" connection 1142 is shown.

The use of flip-chips attached to an interposer can enable multichip module (MCM) techniques. A multichip module can refer to a substrate, carrier, circuit board, interposer, etc. onto which multiple ICs can be placed. The multiple ICs can be attached to the interposer, and the multiple ICs can be wired together using interconnect provided by the interposer. The interconnect associated with the interposer can provide power, control signals, and data between and among the ICs that are attached to the interposer. The power can be provided using modular power techniques. Depending on the particular type of MCM, the interposer can further include discrete components such as discrete resistors, discrete capacitors, discrete inductors, etc. The interposer further includes wiring for interconnecting ICs and the discrete components, if any. The MCM can be packaged and used as if it were a single IC on a board such as a circuit board within a system. MCMs have also been referenced as heterogeneous integration circuits and hybrid integrated circuits. A principal advantage of using MCMs is that multiple electronic components can be enclosed in a single "chip", thereby improving modularity of a system design. Also, the use of MCMs can improve IC yields over ICs produced using monolithic IC design methodologies.

There can be several varieties of MCMs, where the MCM varieties are typically differentiated by size, complexity, design methodologies, and so on. At one end of the complexity scale, an MCM can include standard off-the-shelf ICs. The ICs can be attached to a circuit board such as a printed circuit board and can be used in place of an existing chip or package of chips. The printed circuit board can be designed to match the size pin-out of the existing chip or package of chips. An MCM can also be a complex element. The complex MCM can be based on one or more fully customized IC packages. The fully customized IC packages can be used to integrate multiple IC dies (e.g., unpackaged ICs) onto a substrate that provides interconnection among the dies. Because of the wiring requirements of the multiple IC dies, the substrate typically includes high density interconnection (HDI). The substrates that are used for the MCM can include thin films for interconnects (wires) and dielectrics (insulators); thick films that enable more than one layer of interconnect, and ceramic; and substrates that include laminates based on organics or plastics. The MCM based on thin films of interconnects and dielectrics can result in the highest circuit densities.

The MCM design concepts described previously suggest promising leads for implementing wafer-scale integration ICs. Multiple circuit dies could be fabricated within the same wafer. The wafer could further include built-in self-test (BIST), circuit redundancy to provide spare parts, and "self-rerouting" which can reroute around defective or failed elements and can wire in known good spare parts. In order to enable such capabilities, a significant number of interconnection layers would be required for WSI. Interconnect layer counts of approximately 10 layers have been predicted. In order to implement WSI in a cost-effective manner, several techniques have been proposed such as using an artificial neural network to develop a programmable topology, using a multichip-scale package, and so on.

Another technique that is being developed to enable wafer scale integration is based on the use of a silicon interposer, as discussed above. The silicon interposer, which can be a wafer, can be used to provide interconnections between a wide variety of components. The components include integrated circuits (chips), chiplets, power supplies, power converters, discrete electrical components, and so on. The interposer provides connection points that can be used to mechanically and electrically mount the chips, chiplets, etc. The interposer can be formed from inorganic materials such as glass or silicon, or organic materials such as those used to manufacture printed circuit boards. The electrical connections can be set to a pitch to simplify the attaching of the electrical elements. The electrical connections can be based on standardized manufacturing techniques such as using solder balls, micro-bumps, controlled collapse chip connection (C4) bumps, and electroplated bumps. The bumps on a chip are produced on the "top" side of a wafer (e.g., the non-substrate side) as a final processing step for the wafer. To mount the chips to the interposer, the chips are "flipped" using a flip-chip technique. The bumps at the top of the chips connect to pads on the interposer. The interposer can enable connections from the flip-chip to a standard connection arrangement such as a grid. The interposer can further provide one or more layers of interconnect according to the process used to manufacture the wafer. Thus, higher densities, higher bandwidth, and faster speeds can be achieved. The layers of interconnect are used to provide power and ground, control signals and data, and so on.

Figure 12:
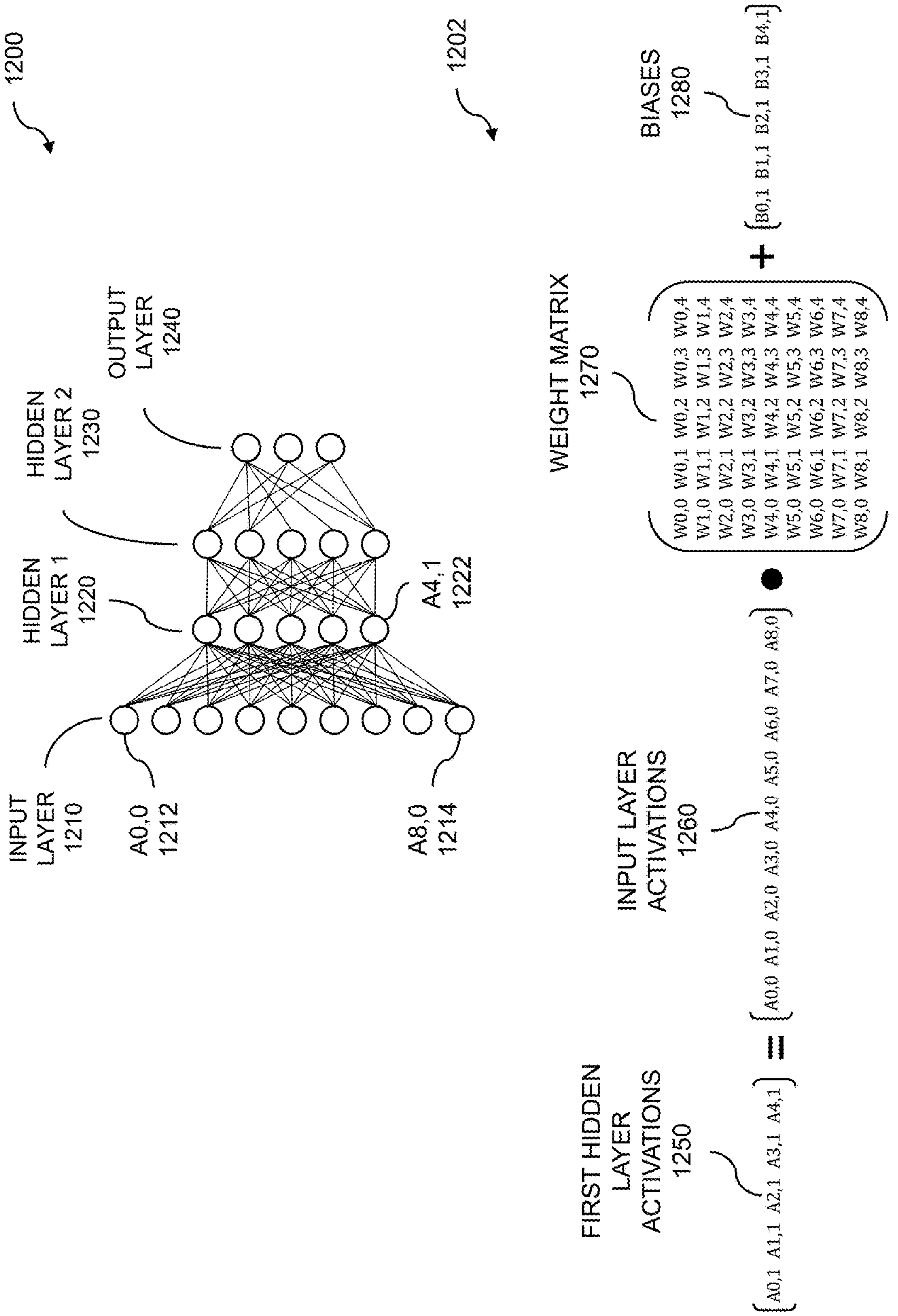
FIG. 12 is an illustration of a neural network.

FIG. 12 is an illustration of a neural network. The neural network (NN) can include a convolutional neural network (CNN). A convolutional neural network can be a type of deep learning system that can learn from data such as training data fed into the system. The training data can be provided with "known good" or expected inferences and results. CNNs can be extensively used for image and video recognition, image classification, image segmentation, natural language processing (NLP), and so on. A CNN can use a few (such as tens), or many (such as hundreds, thousands, etc.) of layers of processing units called neurons. The neurons can enable calculations which can determine a weighted sum of inputs from previous neurons. The neurons can include a bias which can determine or alter the impact of a neuron on a future neuron. The neuron can include an activation function such as a sigmoid function, a rectified linear unit (ReLU) normalization function, and so on to ensure that the value calculated by the neuron remains between 0 and 1. The value stored in the neuron can be called an "activation". The neuron can process any type of data including any floating point format such as single floating-point, double floating-point, brain floating-point 16 (BF16), BF8, and so on. The neurons can be arranged into layers. The output of a neuron in one layer can be used to feed one or more neurons into another layer. One or more layers can comprise fully connected layers where a neuron in a first layer is connected to every neuron in a previous layer. The various layers and connections between layers can form the basis of an inference operation by the neural network.

The illustration 1200 shows an example CNN comprising groups of neurons arranged by layers within a network architecture. The input data for a neuron can come from an original data source, such as a video image, or from a previous input layer of neurons. The output value from each neuron can be used to feed another layer of neurons or can be part of a final output layer. In the illustration 1200, the first layer at the left of the figure can be called the input layer 1210. Each neuron or processing unit in this layer can receive data directly from a source such as a still camera, video camera, passive infrared (PIR) camera, and so on. Neurons can be numbered for identification. For example, 1212 shows a neuron which contains an activation for the first layer at a first neuron. Thus, this neuron can be labeled A0,0. In a similar manner, 1214 shows neuron A8,0, which can refer to the ninth neuron in layer 0. This can indicate that there are 9 neurons/activations in the first layer (e.g., "layer 0") of the neural network. In practice, any layer can contain any number of neurons. The number of neurons in a given layer can be heuristically determined. Large CNNs can have thousands or millions of neurons at the input layer.

The numeric values calculated by each neuron (called activations) in the input layer can become the input for the next layer of neurons. The next layer of neurons can be a hidden layer. Any number of hidden layers can be included in the neural network. In the illustration 1200, the first hidden layer is hidden layer 1 1220 and includes 5 neurons. A second hidden layer 1230 is included which also has 5 neurons. A final layer, an output layer 1240 is shown which includes 3 neurons. The output layer can comprise the final inference from the neural network. For example, if the neural network depicted in 1200 comprises a system for determining whether a traffic light was red, yellow, or green, the top activation function/neuron in the output layer could be for red, the middle could represent yellow, and the bottom green. The final value found in each activation within the output layer can comprise a probability. For example, the final output layer could comprise values (from top to bottom) such as 0.01, 0.2, and 0.99. The strength of the network prediction can grow the closer the output value is to 1. Thus, the neural network in this case can indicate a high probability that the light is green.

In practice any number of neurons can be included in any number of hidden layers. A hidden layer within the CNN can include a truncation layer, a bottleneck layer, and so on. The illustration 1200 shows that every calculated value from the input layer is connected to every neuron in the first hidden layer. The first hidden layer is described as a fully connected layer. Each connection can be associated with a weight and a bias. Weights and biases can determine how much the value in the current neuron should affect other neurons in the next layer. Thus, the connection between A0,0 1212 and A4,1 1222 can include a first weight, while the connection between A8,0 1214 and A4,1 can include a different weight. A unique bias can be associated with A4,1. The weights can be labelled to make it clear which nodes are coupled between a previous layer and a current layer. For example, for the first hidden layer, W0,0 can couple neuron 0 from the input (previous) layer to neuron 0 in hidden layer 1 (the current layer).

In a similar way, the value for each neuron in the first hidden layer can be determined by a large matrix multiply function as shown in illustration 1202. Each activation function in the first hidden layer can be represented by a 1-dimensional vector such as shown at 1250. The activations from the input layer can be shown in another 1-dimensional matrix such as 1260. A 9×5 matrix can be created which includes all weights between the first input layer and the first hidden layer as shown at 1270. In practice, the weights can comprise any number of rows and columns according to the size (e.g., number of neurons) of the layers. Finally, the biases associated with each connection from the input layer to the first hidden layer can be represented in a 1-dimensional matrix such as 1280. For example, in the illustration 1200, the value of A4,1 1222 can be the sum of all the weighted (W) inputs from the previous layer, with a final bias added as shown in the following equation: A4,1=[(A0,0*W0,4)+(A1,0*W1,4)+ . . . +(A8,0*W8,4)+B4,1]. As stated previously, the activation A4,1 can include a non-linear transformation such as a sigmoid, ReLU, Tanh, and Softmax. The non-linear transformation function can ensure that the value of the activation remains between 0 and 1 and does not "saturate" with a value or 1 or a value of 0.

Each transition to a different layer within the neural network can require a different matrix multiplication function. Thus, a neural network with many layers can heavily tax a processor core. As the number of neurons/activations within the layers grows, the matrix multiplication function grows increasingly complex. For example, the total number of weights and biases in a neural network can be called the number of parameters in the system. In the case of illustration 1200, relatively few parameters have been included. In the first layer, each of the 9 neurons is connected to 5 neurons, with each connection including a weight. A separate bias can be included for each of the 5 neurons. Thus, in an example configuration, the first layer can include 9×5+5=50 parameters. The second layer includes 5 neurons connected to another 5 neurons at the next layer, each connection including a weight. Again, a bias can be included for each neuron. Thus, the parameter count for the second layer as shown is 5×5+5=30. The third layer comprises 5 neurons with each neuron connected to 3 neurons in the output layer, where each connection also includes a weight. A bias can be included for each of the three neurons. Thus, the number of parameters is 5×3+3=18. Thus, the number of total parameters in the system can be 50+30+18=98.

Consider a large neural network used for modern large language models. As these networks can comprise billions or trillions of parameters, the matrix multiply function can be exceedingly large. To lessen processing bottlenecks, the matrix multiply functions required, which can include matrices with hundreds, thousands, or even millions of rows and columns, can be broken up based on submatrices and distributed across many special purpose processors. This technique can decrease the processing time required to perform each matrix multiply. However, this approach can drive bandwidth requirements between many processors and many memory chips as the single large matrix multiply can be split, sent to many processors for execution, collected at a central processor, and then the result must be combined. In large neural networks, this can occur for every inference, driving large memory bandwidth requirements. For example, if 1 billion parameters are used in a neural network, each saved in a single precision floating point format (32-bits), the resulting model could require tens of megabytes (MB) of memory simply to store the parameters of the network. A neural network with 1 trillion parameters could require tens of gigabytes (GB) of memory. As discussed below, training the neural network can drive the need for additional bandwidth as each processor must keep a copy of the previous activations, weights, and biases that are required to perform a matrix multiply. In addition, the training data, which can also be quite large, must be sent. In sum, while neural networks have driven processor improvements, especially in matrix multiply efficiency, the bandwidth needed to keep each processor occupied in a large neural network remains a significant challenge. This can be especially true for some neural networks such as transformers. In these cases, bandwidth requirements of running inferences can place a larger demand on the system than even training (as described below).

Figure 13:
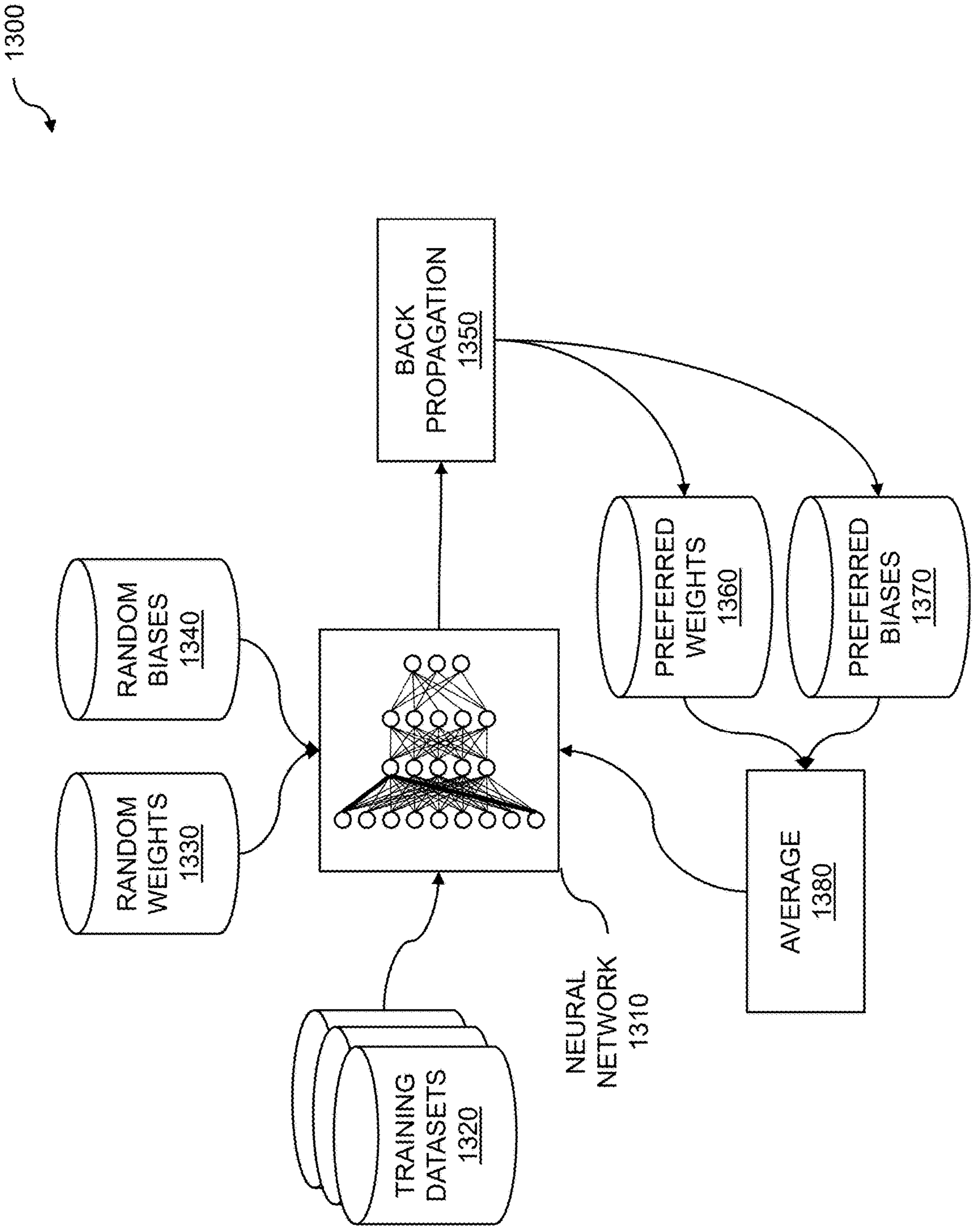
FIG. 13 is an example of training a neural network.

FIG. 13 is an example of training a neural network. A neural network, as previously described in illustration 1200, is shown in example 1300 at 1310. The neural network can comprise any number of neurons/activations. Training datasets 1320 can be provided to the neural network to train the neural network. The training datasets can be based on the type of inference required from the neural network. For example, if it is desired for the network to identify a type of animal, then the training set can include many different types of animals in many different settings and environments. In practice, a large amount of data is required to train a network to properly perform an inference. For example, in video processing/recognition, a rule of thumb can be 10 training images per parameter. Thus, a small neural network with 1,000 parameters could have 10,000 images or more for training. If these images are large, the memory requirement to store them can also be large. For example, 10,000 8-bit greyscale images in a resolution of 720×720 pixels could require: (8-bits/pixel)×(518,400 pixels)×(10,000 images)=40.5 GB. The memory requirement would be higher for color images or higher resolution images. To train a neural network, each of these images can be sent to the input layer of the neural network for training, requiring wide and fast memory connections to the processors performing the training.

The neural network can begin with a random set of weights 1330 and biases 1340. In some embodiments, a previous set of weights and biases may be used or have been obtained prior to training and used in place of purely random values. The training process can alter those weights and biases such that an accurate inference can be performed with inputs that the neural network has not previously seen. To train the network, a first image from the first training dataset can be sent to an input layer, as described in the previous figure. Each layer of the neural network can then calculate values based on a weighted sum of each connected neuron in the previous layer. This calculation continues until all neurons in all layers have generated an input. The final values can be captured at the output layer of the neural network. The training can comprise a supervised training. In supervised training, a desired output for each neuron in the output layer can be pre-determined along with each training image. The pre-determined desired output can be a label. A cost function can be created for each training image, which can be obtained by adding the squares of the differences between the result of each neuron in the output layer and the desired result (which can be found in the label of the training data) of that neuron.

Training can reduce the cost function associated with every training image by determining a gradient of the cost function for each image. This can be computed by back-propagation 1350. The back-propagation process can determine, for each neuron in the network, what changes should be made to its associated weight and bias to reduce the cost function most effectively. Since a neuron in a layer N is affected by the previous layer N−1, the neurons in N−1 must also be adjusted. Thus, back-propagation can be an iterative algorithm starting from an output layer of the neural network and ending at the input layer. To train the neural network, each image can be processed forward through the neural network and then back-propagated through the network to determine changes necessary for a more accurate inference in the future. This process can be repeated for each image in the training set. Because of the large amount of data required to keep all images in memory, the training data can be randomly divided into datasets which can also be "mini batches". Training the network can take place on one mini batch at a time to lower bandwidth and compute requirements. For example, the neural network can perform forward processing and back-propagation on the first training image within the first mini batch, resulting in a first set of preferred weights 1360 and biases 1370. The preferred weights and biases can reflect a desired value for the weight and bias at every neuron to more accurately predict an output based on the first training image within the first mini batch. The neural network can then perform the same function on a second image, resulting in a second set of preferred weights and biases. This process can be repeated for each image in the mini batch. Once each image is processed, and an associated set of preferred weights and biases is computed, each preferred weight and bias for each node can be averaged 1380 to determine the final adjustment that will be made to the actual weights and biases in the network due to the mini batch of images. Once the neural network is updated, another mini batch of training images can be used to further train the network in the same way.

Consider a large neural network with billions of parameters and large matrices that must be calculated to determine each activation. Also consider the large amount of training image data that must be sent to the network and the amount of data that must be maintained during training (including the intermediate weights and biases for each node resulting from each training pass of each image in a mini batch prior to averaging). Finally, consider that a large neural network can be distributed across many functional processors, all with a need to access a relevant portion of the data described above. The bandwidth requirements for training such a neural network are extremely high. New methods and technologies can be required to feed such a distributed network.

Figure 14:
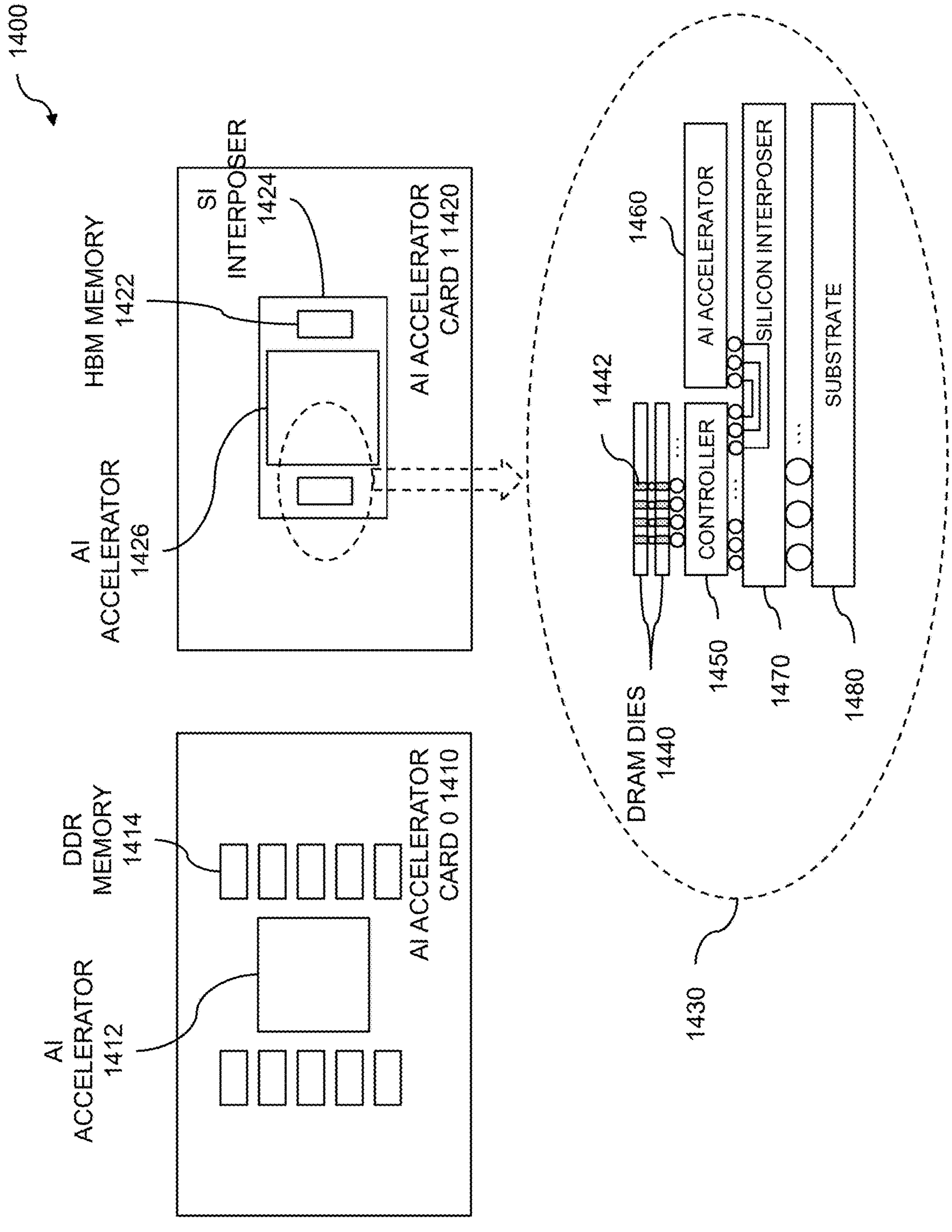
FIG. 14 is an example of enhancing memory bandwidth.

FIG. 14 is an example of enhancing memory bandwidth. As discussed above, modern large neural networks can include billions or even trillions of parameters, requiring many gigabytes of memory or terabytes of memory to simply store the model. Training these large networks can require much more memory as thousands, hundreds of thousands, millions, or more samples of images, videos, text, papers, sentences, and so on must be presented to the neural network and then back-propagated through the network to determine adjustments for each of the numerous weights and biases comprising the network. Gradients, intermediate values for weights and biases, and so on must also be stored, further pressuring memory bandwidth. Dividing the processing requirements for training and/or inference by the neural network can be straightforward. For example, a matrix multiply function can be divided into multiple smaller matrix multiply functions, and then assembled to produce the product of the matrix multiply function in a future step. However, handling the bandwidth requirements between processing cores can adversely affect network training time and inference performance.

Multiple approaches have been used to increase memory bandwidth including using Static DRAM (SDRAM), Double data rate DRAM (DDR), and so on. The example 1400 shows an AI accelerator card 0 1410. The accelerator includes an AI accelerator 1412. The AI accelerator can include processing cores, custom cores, matrix multiply units, multiply accumulators (MACs), and so on. The AI accelerator can be designed specifically to increase the speed of matrix multiply and other functions associated with the neural network. The AI accelerator card can include DDR memory 1414. The DDR memory can be DDR1, DDR2, DDR3, DDR4, DDR5, and so on. While each generation of DDR memory has improved bandwidth, the memory chips communicate with the AI accelerator only via the AI accelerator card. The DDR memory can comprise any type of memory. While the memory can be physically close to the accelerator, signals must still travel off a silicon die, through a package, across the board, and through another package to the destination die. This can require long cycle times in comparison to the speed of the memory chips and/or AI processors. In addition, the width of the memory buses to and from the AI accelerator chips can be limited due to the need to interface between multiple physical packages.

An improvement in bandwidth can be achieved by 2.5D technology. The example 1400 shows an example of 2.5D technology in AI accelerator card 1 1420. In this case, high bandwidth memory (HBM) 1422 can be included on the same silicon interposer 1424 as the AI accelerator 1426. As shown in 1430, two DRAM dies 1440 can be stacked within the HBM memory. In practice, any number of DRAM dies can be stacked. The DRAM chips can communicate with each other and to a memory controller 1450 via through-silicon vias (TSVs) 1442. Although example 1400 shows DRAM chips, in practice, any type of memory chip can be coupled with 2.5D technology, including LPDDR, GDDR, SRAM, VRAM chips, and so on. The controller and the AI accelerator 1460 can be coupled to the same silicon interposer 1470. The coupling can include micro-bumps, controlled collapse chip connections (C4s), and so on. Communications between the memory controller and the AI accelerator can therefore be accomplished within metal layers of the silicon interposer, improving latency, signal integrity, and/or bandwidth as many more wires can be established within the silicon wafer than would have been possible with a typical packaging interface as shown in 1410. Thus, an extremely high bandwidth bus between the memory and AI accelerator can be established. The silicon interposer can be coupled to a substrate 1480 which can be soldered to AI accelerator card 1. This memory implementation can improve a local bandwidth path between memory to a single AI accelerator (which can include many processors). However, for larger neural networks, bandwidth improvements are also required at the system level between multiple AI accelerators.

Figure 15:
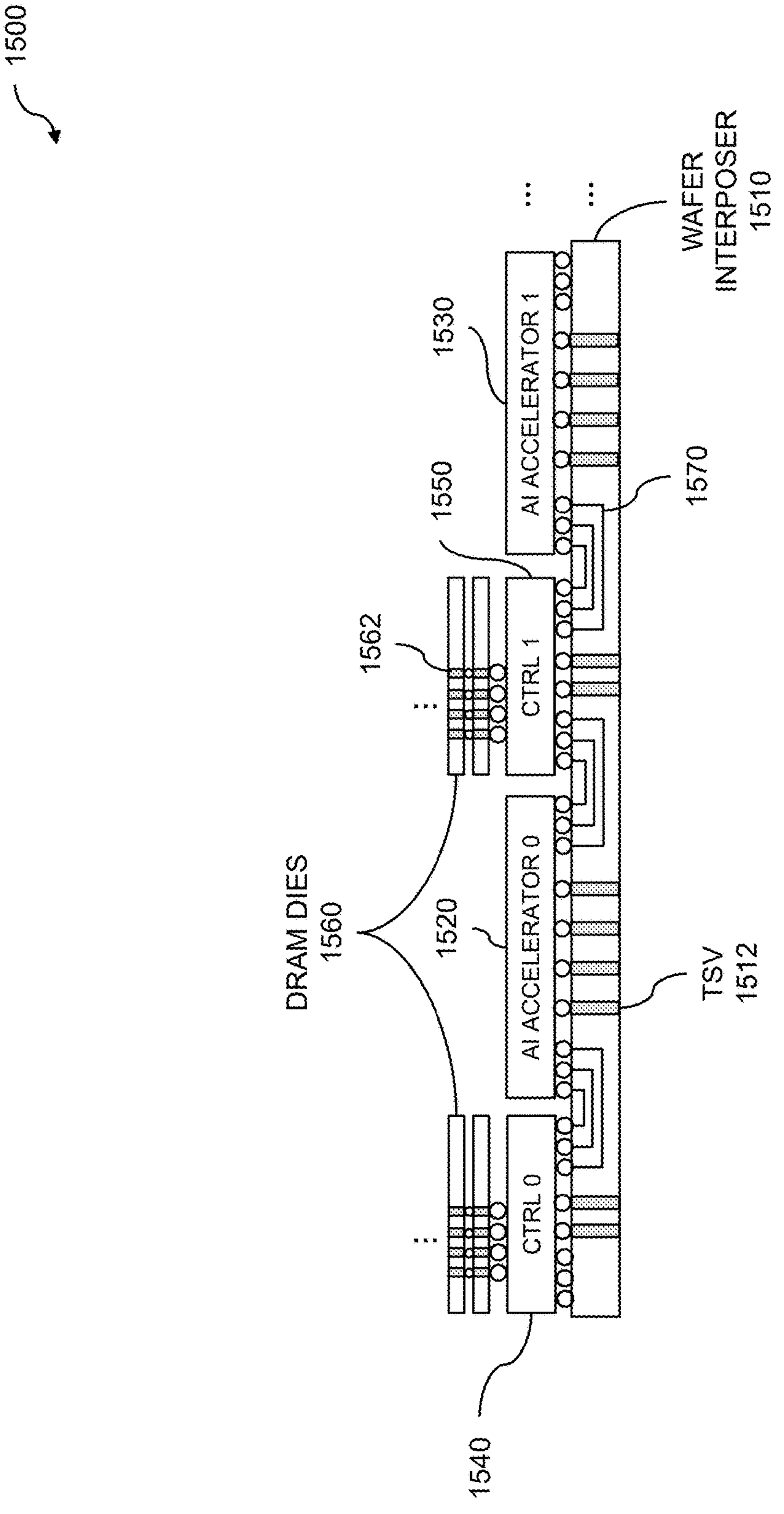
FIG. 15 is a cross-section of wafer scale integration for neural network memory bandwidth.

FIG. 15 is a cross-section of wafer scale integration for neural network memory bandwidth. As described above, the need for memory bandwidth, especially for large neural networks, can be performance limiting. While memory technology such as 2.5D can improve local memory bandwidth, system-wide memory bandwidth is still a significant technical challenge. Wafer scale integration can significantly improve these bandwidth requirements. The cross-section 1500 shows a wafer interposer 1510. The wafer interposer can comprise a 300 mm wafer, a 200 mm wafer, and so on.

The wafer interposer can include any number of through-silicon vias (TSVs) 1512. The TSVs can enable communications between the front side and the back side of the wafer. To reliably process the TSVs, the back side of the wafer can be polished, ground, and so on. A plurality of AI accelerators, such as AI accelerator 0 1520 and AI accelerator 1 1530 can be coupled to the wafer interposer. The coupling can include micro-bumps, C4s, and so on. The AI accelerators can be coupled to a plurality of memory controllers, such as memory controller 1540, 1550, and so on. The memory controllers can be based on SDRAM, DDR1, DDR2, DDR3, DDR4, DDR5, HBM, and so on. The memory controllers can be coupled to any number of memory chips. The memory chips can be based on 2.5D technology, which can enable stacking of one or more memory dies 1560. The memory dies can communicate to other memory dies and to the respective controller by TSVs 1562. The memory can be coupled to one or more AI accelerators by wiring paths 1570 within the wafer interposer. Though AI accelerators and memory chips are shown in cross section 1500, in practice any type of chips can be incorporated including processors, system-on-chips (SoCs), application-specific integrations circuits (ASICs), and so on. The wafer interposer can be processed using a back-end-of-line (BEOL) wafer process which can include any number of metal layers. These metal layer can be used to couple any AI accelerator to any memory controller. The wafer metal layers can provide extremely high bandwidth between any memory controller and any AI processor on the wafer.

The wafer scale integration approach shown in FIG. 15 can address the system level bandwidth requirements necessary for larger neural networks. Recall that neural networks with parameter sizes into the billions or trillions can require significant memory for the model. Recall also that training a large neural network can require a number of training images that can be ten times (or more) the number of parameters. Each of these models must be presented to the network for a forward and back-propagation training pass. Multiple intermediate sets of weights and biases for each node in the neural network can also be stored and maintained though the training process. Further, because the matrix functions for larger neural network are far too large for any single processor, the processing mentioned above can be divided and sent to many processors, and can span many chips, cards, server racks, or even data centers. While adding additional processors can be straightforward (though expensive), keeping those processors efficiently running can be an extremely difficult task, often gated by memory bandwidth as relevant data must be sent to every processor, regardless of location. Wafer scale integration can reduce bandwidth bottlenecks between many AI accelerators (which can comprise many processor cores, specialized AI cores, accelerators, and so on) and significant amounts of memory. As a result, an entire medium to large size neural network can be fully trained and run inferences on a single wafer interposer. For larger models, such as ChatGPT, any number of wafer interposers can be coupled together to provide a significant improvement in bandwidth and computation speed.

Figure 16:
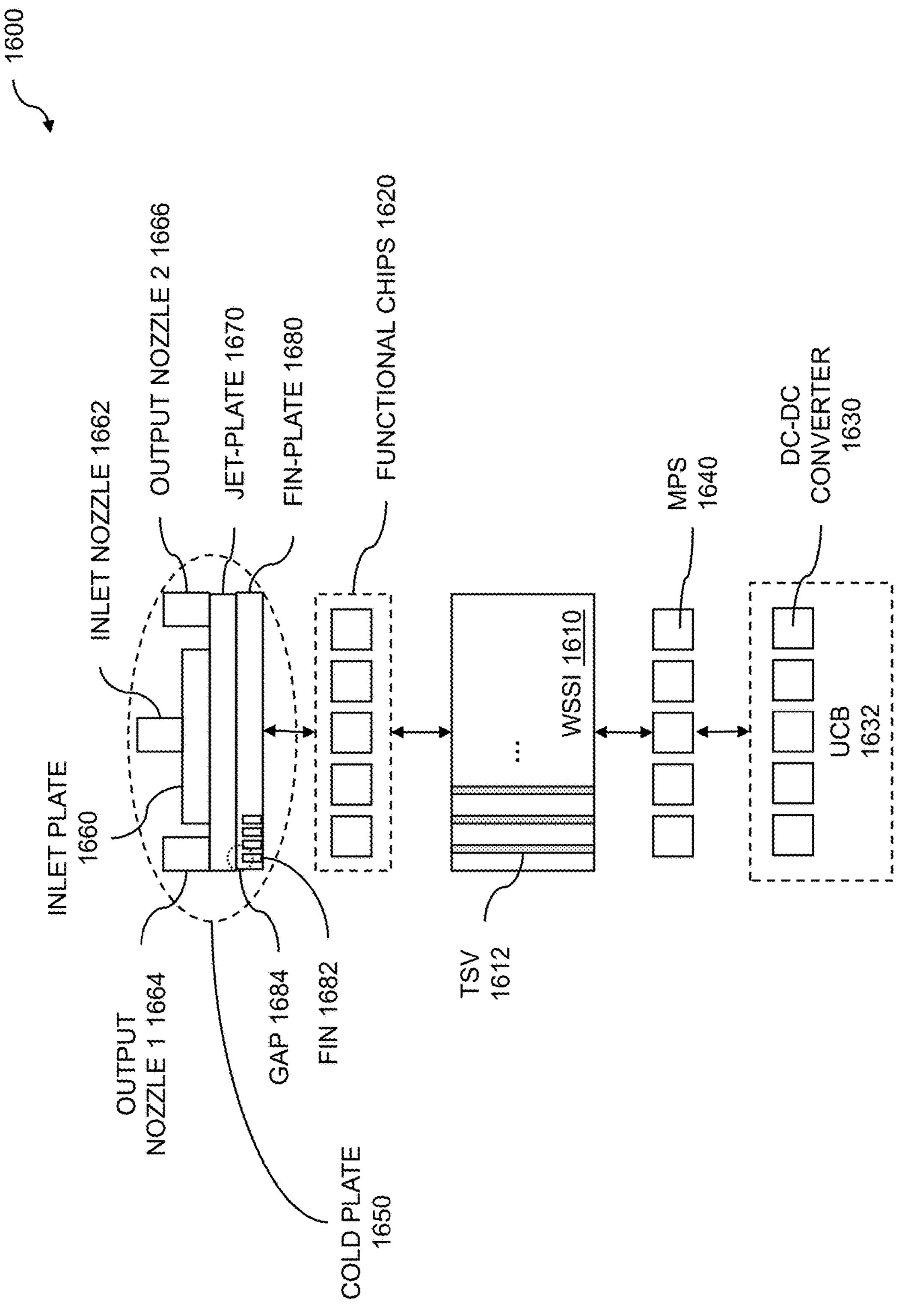
FIG. 16 is a system diagram for cold plate cooling for wafer-scale integration with back side modular power delivery.

FIG. 16 is a system diagram for a cold plate for back side wafer-scale integration with modular power delivery. The cold plate accomplishes cooling of a wafer-scale silicon interposer (WSSI). Recall that the WSSI can be bonded to a plurality of functional chips. The functional chips can include processors, multiprocessors, machine learning (ML) processors, graphics processors, memories, and so on. As the functional chips are operating, the chips can generate prodigious amounts of heat. The heat can be generated by IR drops resulting from providing power to the functional chips. The power can be provided to the functional chips based on modular power delivery. The heat, if not removed, can cause damage to functional chips. The damage can include electrical damage to electronic circuits, causing the circuits to degrade or fail. The damage can further include mechanical damage to the chips such as cracking or delamination. The cold plate, by cooling the WSSI, enables wafer-scale integration (WSI) with modular power delivery.

Disclosed is a system for cooling comprising: a wafer-scale silicon interposer (WSSI), wherein a front side of the WSSI is bonded to a plurality of functional chips, wherein the plurality of functional chips create heat during operation, wherein the WSSI includes a plurality of through-silicon vias (TSVs), and wherein a back side of the WSSI is coupled to a plurality of DC-to-DC power converters; a cold plate, wherein the cold plate comprises an inlet plate, a jet-plate, and a fin-plate, wherein the inlet plate includes at least one inlet nozzle, wherein the jet-plate includes one or more outlet chambers, wherein the system, when supplied with a coolant at a first temperature, is configured to: send the coolant at a first temperature into the at least one inlet nozzle located on the inlet plate; spray the coolant, by the jet-plate, on the fin-plate; transfer at least a portion of the heat that was created, by the cold plate, to the coolant that was sent; and capture the coolant, at a second temperature, from the one or more outlet chambers within the jet-plate.

The system 1600 includes a wafer-scale silicon interposer (WSSI) 1610. The WSSI can comprise an inorganic wafer such as a silicon wafer, a glass wafer, and so on. The WSSI can include an organic wafer. The WSSI includes a plurality of through-silicon vias (TSVs) 1612. A TSV can include an electrical connection that completely passes through a wafer such as a silicon wafer or a die. The plurality of TSVs is oriented vertically in order to enable connections between the front side of the wafer and the back side of the wafer. A front side of the WSSI is bonded to a plurality of functional chips 1620. The functional chips can include general purpose chips such as processor chips, multiprocessor chips, graphics processor chips, application-specific integrated circuits (ASICS), systems-on-chip (SoCs), memory chips, artificial intelligence (AI) and machine learning (ML) accelerators, and so on. The plurality of functional chips creates prodigious heat during operation. The heat can be due to current provided to the functional chips such as active current, overcurrent, leakage current, and so on. The heat can result from IR drops associated with interconnect, active devices, leakage current, etc. within the functional chips. The functional chips can be bonded to the WSSI via micro-bumps, controlled collapse chip connections (C4s), and so on.

The back side of the WSSI can be coupled to a plurality for DC-to-DC power converters 1630. The DC-to-DC converters can convert DC power from a high DC voltage range, such as 48 volts to 54 volts, to a lower DC voltage range, such as 12 volts to 13.5 volts. The DC-to-DC converters can be mounted on a unified control board (UCB) 1632. The UCB can provide controls such as control signals, and power such as DC power to the DC-to-DC converters. The UCB can comprise a single control board. The single control board can include an organic control board or an inorganic control board. The UCB can comprise multiple control boards and/or circuits. The UCB can be mechanically connected to a plurality of modular power supplies (MPS) 1640. The mechanical connection can be accomplished using a variety of connection techniques, where the connection techniques can be accomplished using locking connectors, non-locking connectors, and so on. The connectors can include rigid connectors, flexible connectors, and the like. The mechanical connection can be based on a high voltage socket, one or more rigid-flex strips, and so on. The modularity of the MPSs can allow for movement between the UCB and the WSSI. Movement, such as a linear displacement, can be due to differences in coefficients of thermal expansion (CTE). The MPS can provide a second voltage conversion, resulting in an operating voltage appropriate for operating the functional chips. The second voltage conversion can provide an additional voltage appropriate for I/O circuits. In a usage example, the operating voltage can include 1 volt or less, such as 0.85 volts. In a usage example, the additional voltage can include 1.2 volts. The back side of the MPSs can be mounted to the WSSI via micro-bumps, controlled collapse chip connections (C4s), and so on. Thus, the back side of the WSSI can comprise power delivery for the plurality of functional chips which can be mounted on the front side of the WSSI. Power is delivered from the plurality of the DC-to-DC power converters to the plurality of functional chips by the plurality of TSVs.

The system 1600 includes a cold plate 1650. The cold plate can be attached to the plurality of functional chips to remove heat from the functional chips. The cold plate can include a plurality of plates. In embodiments, the cold plate comprises an inlet plate 1660, a jet-plate 1670, and a fin-plate 1680. The plates can include a variety of materials that are suitable for capturing and transferring heat. In embodiments, the inlet plate, the jet-plate, and the fin-plate are comprised of copper. The constituent plates of the cold plate can be coupled to form the cold plate. The cold plate is attached to the plurality of functional chips in order to transfer at least a portion of the heat that was created by the functional chips. The transferring the at least a portion of the heat is accomplished using a coolant. The coolant can include a coolant liquid such as distilled water, deionized water, liquid mixtures such as glycol/water liquid mixtures, dielectric fluids, and so on. The attachment of the cold plate to the plurality of functional chips can include a thermal interface material (TIM) (not shown). The TIM can conduct heat between surfaces such as the functional chips and the fin-plate, thereby enabling more efficient heat transfer to cool the functional chips. The TIM can comprise thermal tape, grease, gel, adhesive, phase change materials (PCMs), metal TIMs, pyrolytic graphite, and so on. In a usage example, the TIM can include an uncured TIM such as an uncured epoxy, a gap filler, and so on. The uncured TIM can remain flexible so that differences in coefficients of thermal expansion (CTE) between the fin-plate and the functional chips to which the fin-plate is attached do not introduce strains that could cause damage to the functional chips. The uncured TIM can further reduce the risk of cracking and delamination between the heatsink and the TIM.

The system can include an isometric grid array (IGA). Further embodiments include mounting the cold plate to an isometric grid array (IGA), wherein the IGA provides stiffening for the WSSI. The mounting of the cold plate to the isometric IGA can be accomplished using one or more screws, clips, locking fasteners, and so on. In embodiments, the mounting is based on one or more spring-loaded fasteners. IGA can provide stiffening for the WSSI. The stiffening for the WSSI can be particularly critical because the WSSI can be thin. As described above, the WSSI, especially when ground to accommodate TSVs, can be fragile. The IGA can provide support for the WSSI by enhancing stability of the WSSI, stiffness of the WSSI, etc. Enhancing the stiffness of the WSSI can significantly reduce the risk of the WSSI cracking, even under its own weight. The IGA can comprise a grid. The back side of the WSSI can be inserted into the IGA. The back side of the WSSI can remain accessible via a plurality of open recesses within the IGA. The cold plate can then be screwed to the IGA, thus pressing the cold plate to the functional chips on the front side of the WSSI. In this way, the IGA can also enable coplanarity for the WSSI.

The system 1600 includes at least one inlet nozzle 1662. The inlet nozzle is located on the inlet plate. The inlet nozzle can be used to receive a liquid such as a coolant liquid. In embodiments, a coolant at a first temperature is sent into at least one inlet nozzle located on the inlet plate. The coolant can include distilled water, deionized water, etc. The coolant can be chilled. The chilling of the coolant can be accomplished using a heat exchanger. In embodiments, the inlet nozzle within the inlet plate can be orthogonal to a heat extraction plane within the fin-plate. This orthogonality can enable separation of power (from the back) and cooling (from the front) when the WSSI is used in a rack, a data center, and so on. The jet-plate 1670 sprays the coolant that was received on the fin-plate. In embodiments, the spraying occurs at a location on the fin-plate corresponding to each functional chip within the plurality of functional chips. In a usage example, the spraying can be accomplished by a plurality of holes in the jet-plate. A diameter of a first hole within the plurality of holes at a first distance from the center of the jet-plate can be a different size from a second hole within the plurality of holes at a second distance from the center of the jet-plate. In a usage example, the size of the second hole can be larger than the first hole. The larger size of the second hole can enhance coolant flow. The enhanced coolant flow can be desirable because the coolant at the location of the second hole can have a temperature that is higher than the coolant temperature at the first hole. The difference in coolant temperature can be due to heat received by the coolant in the vicinity of the first hole.

The system includes one or more outlet chambers. The one or more outlet chambers can be accessed via one or more output nozzles such as output nozzle 1 1664 and output nozzle 2 1666. Embodiments include capturing the coolant, at a second temperature, from one or more outlet chambers within the jet-plate. The second temperature results from extraction of at least a portion of the heat generated by the functional chips by the cold plate. The captured coolant can be cooled to the first temperature using a heat extraction technique such as a heat exchanger. When the captured coolant has been cooled to the first temperature, the coolant can be reintroduced to the cold plate via the inlet nozzle. The movement of the coolant into the cold plate, from the cold plate, through the heat exchanger, and so on can be accomplished using a pump, a turbine, etc.

In embodiments, the fin-plate comprises a plurality of internal fins 1682. The fins can increase the surface area of the fin-plate so that heat from the functional chips can be more easily transferred to the coolant. The internal fins can include one or more cross-sectional profiles. The cross-sectional profiles can include a square, diamond, or rectangular profile; a round or oval profile; and so on. In embodiments, at least a portion of the heat that was created is transferred, by the cold plate, to the coolant that was sent. Since the internal fins can increase the surface area of the fin-plate, a larger portion of heat can be transferred to the coolant than could be transferred were the fins not present. In embodiments, the plurality of internal fins includes one or more structural pillars. The structural pillars can include a shape, cross-section, and so on that are similar to the internal fins or are different from the internal fins. The structural pillars can enhance the physical integrity of the cold plate. In embodiments, the structural pillars provide rigidity between the jet-plate and the fin-plate, wherein the structural pillars include mechanical connections between the jet-plate and the fin-plate. The structural pillars can enable the jet-plate and the fin-plate to be fixed in a specific orientation such as a parallel orientation to each other. The pillars can include one or more materials. In embodiments, the one or more structural pillars are comprised of copper. The structural pillars can enable the jet-plate and the fin-plate to be fixed at a specific distance from one another. In embodiments, a height of each internal fin within the plurality of internal fins provides a gap 1684 to a top of the jet-plate from a bottom of the fin-plate. The gap at the top of the jet-plate from the bottom of the fin-plate can enhance coolant flow through the cold plate, thereby enhancing heat transfer from the functional chips to the coolant.

Figure 17:
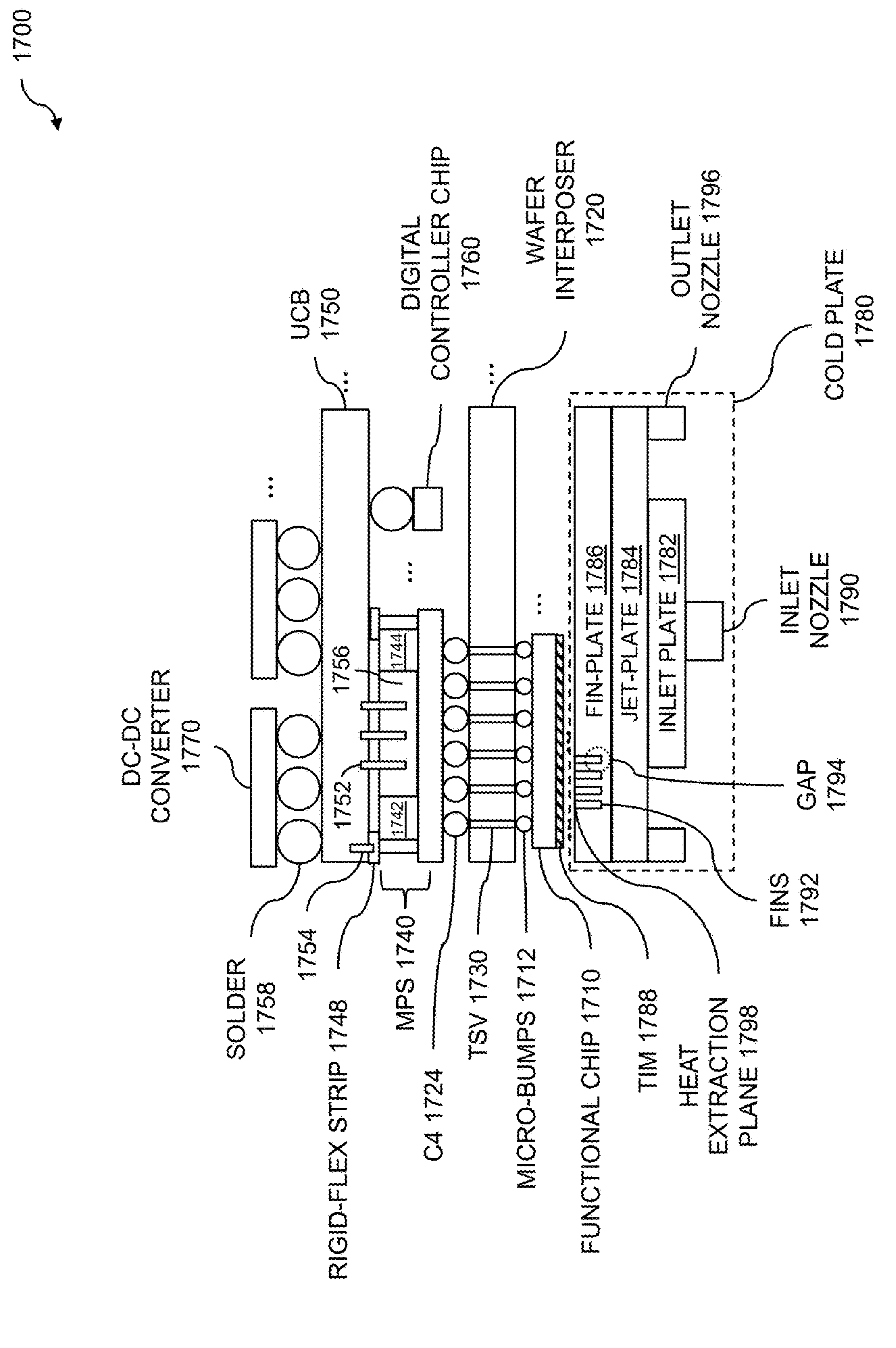
FIG. 17 is a cross-section of an apparatus for cold plate cooling for wafer-scale integration with back side modular power delivery.

FIG. 17 is a cross-section of an apparatus for a cold plate for back side wafer-scale integration with modular power delivery. The cold plate accomplishes transferring to a coolant that has sent at least a portion of heat that was created by a plurality of functional chips. Discussed throughout, a cold plate can be used to remove at least a portion of heat generated by a plurality of functional chips. The functional chips can be bonded to a wafer-scale silicon interposer (WSSI). The WSSI can be used to achieve wafer-scale integration (WSI). The WSSI can be used to mount various elements and to provide interconnections among the mounted elements. The silicon interposer can include other inorganic materials such as glass. An apparatus for cooling comprises: a wafer-scale silicon interposer (WSSI), wherein a front side of the WSSI is bonded to a plurality of functional chips, wherein the plurality of functional chips creates heat during operation, and wherein the WSSI includes a plurality of through-silicon vias (TSVs), wherein a back side of the WSSI is coupled to a plurality of DC-to-DC power converters; a cold plate, wherein the cold plate comprises an inlet plate, a jet-plate and a fin-plate; at least one inlet nozzle located on the inlet plate, wherein the inlet nozzle receives a coolant at a first temperature, and wherein the jet-plate is used to spray the coolant that was received on the fin-plate, and wherein at least a portion of the heat that was created is transferred, by the cold plate, to the coolant that was sent; and one or more outlet chambers within the jet-plate, wherein the one or more outlet chambers capture the coolant at a second temperature.

The apparatus 1700 can include a functional chip 1710. The functional chip can include a processor chip, a multi-core processor chip, a graphics processor chip, a system-on-a-chip, a memory chip, an application-specific integrated circuit (ASIC), an artificial intelligence (AI) or machine learning (ML) accelerator, and so on. The functional chip can include an integrated circuit designed for a flip-chip application. A chip design for a flip-chip application can include a chip for which connections to the chip are accomplished at the top layer of the chip. The connections can include positive and negative DC power connections, data connections, control connections, and so on. The various chip connections can include pads on the top layer of the chip. The functional chip can include a chip that can accomplish a processing function such as a deep learning function. Various techniques can be used to make connections to the top of a functional chip. In a usage example, a technique based on micro-bumps 1712 can be used. A micro-bump can be associated with each connection point or pad on the chip. The micro-bumps can comprise a dense array of connection points or pads. The micro-bumps can include a material appropriate for mounting the chip to a substrate, a board, and interposer, and so on. The micro-bumps can include solder micro-bumps. This micro-bumps can be arranged in a ball grid array (BGA) or some other geometry. The plurality of functional chips create heat during operation. The heat can be due to active current, overcurrent, leakage current, and so on. The heat results from IR heating within the functional chips.

The apparatus 1700 includes a wafer interposer 1720. The wafer interposer can include an interposer that enables wafer-scale integration (WSI). The wafer interposer can include organic materials or inorganic materials. In embodiments, the interposer includes a wafer-scale silicon interposer (WSSI). Other inorganic materials can be used. In a usage example, the wafer interposer can include a glass interposer. Micro-bumps discussed above can be used to mount the one or more functional chips to the wafer interposer. Communications between the functional chips can be accomplished within metal layers of the silicon interposer, improving latency, signal integrity, parasitics, and/or bandwidth as many more wires can be established within the silicon wafer than would have been possible with a typical packaging interface. Thus, the WSSI can enable extremely high bandwidth buses and control signals between chips mounted to the WSSI. In a usage example, the WSSI includes one or more optical waveguides. The optical waveguides can enable chip-to-chip communications via light. The optical waveguides can comprise the buses and control signals between chips. The wafer interposer can also be used to attach additional boards, modules, components and so on. The further attachments can be located on the opposite side of the of the wafer interposer from the mounted functional chips. The further wafer interposer attaching can be based on one or more controlled collapse chip connection bumps (C4s) 1724. The wafer interposer can provide connections between the micro-bumps on one side of the wafer interposer and the other side of the wafer interposer. In embodiments, the WSSI includes a plurality of through-silicon vias (TSVs) 1730. The TSVs can provide a connection between the micro-bumps and the C4s. The TSV connections can be used to deliver power to the functional chips through the back side of the WSSI, as is described below.

The apparatus 1700 includes a plurality of modular power substrates (MPS) 1740. Embodiments include a plurality of modular power substrates (MPSs) wherein the plurality of MPSs is attached to a back side of the WSSI. An MPS can be based on a form factor. The form factor of the MPS can be associated with or dependent on components mounted to the wafer interposer. In embodiments, the plurality of MPSs is based on a form factor mirroring the corresponding functional chip. The form factor of the MPS can have a 1:1 relationship to the one or more corresponding functional chips or can include other shape factors. The MPSs can be based on a variety of materials. In a usage example, one or more MPSs within the plurality of MPSs comprise an inorganic substrate. An inorganic substrate can include a silicon substrate, a glass substrate, and so on. In another usage example, one or more MPSs within the plurality of MPSs comprise an organic substrate. The organic substrates can include substrates such as printed circuit boards. Recall that the functional chips are mounted to the front or top side of the WSSI. In embodiments, the plurality of MPSs is attached to a back side of the WSSI. Connections between the wafer interposer and the MPS can be accomplished using the C4s described above.

The MPS 1740 can include a plurality of step-down power modules and/or DC-to-DC converters such shown at

1742 and 1744. As shown in a previous diagram, the DC-to-DC converters on an MPS can be placed across the MPS. The DC-to-DC converters on the MPSs can accomplish altering of a DC voltage. The altering the DC voltage can result in a second DC voltage. In a usage example, the power can be altered, wherein altering, by the plurality of MPSs, is accomplished by the DC power that was sent, and wherein the altering is based on a second voltage conversion. The second voltage conversion can include a second DC-to-DC voltage conversion. In embodiments, the second voltage conversion results in a voltage less than a threshold. The threshold can include a voltage appropriate to a voltage required by a functional chip. In embodiments, the threshold can include 1 volt.

An MPS can include a connector 1756. The connector can be used to mechanically connect the MPS to a unified control board (UCB). The connector can include a socket on the UCB. The mechanical connection can include one or more plugs, pins, etc. 1752 which can be inserted into the socket. In embodiments, the mechanical connection is based on a high voltage socket, wherein the high voltage socket transfers power from the UCB to the plurality of MPSs. The high voltage socket can be used to provide a first DC voltage that can be converted to a second DC voltage by one or more DC-to-DC converters. In embodiments, the mechanical connection accommodates a maximum lateral displacement of the UCB due to thermal expansion during operation. The lateral displacement can result from thermal expansion of the WSSI, the UCB, and/or the MPS during operation. In addition to the power connector, the MPS can include a rigid-flex strip 1748. The rigid-flex strip can provide a mechanical connection between the MPS and a UCB. The plurality of rigid-flex strips can provide control signals, data, and so on. In embodiments, the mechanical connection can include a plurality of rigid-flex strips. In further embodiments, the plurality of rigid-flex strips includes one or more power control signals from the digital controller chip to the plurality of MPSs. The plurality of rigid-flex strips can include one or more signals such as one or more power control signals. In embodiments, the plurality of rigid-flex strips carries at least a portion of DC power from the plurality of MPSs to the plurality of functional chips. The rigid-flex strips can include a socket into which one or more plugs, pins, etc., such as 1754, can be inserted to couple the rigid-flex strip to the UCB.

The apparatus 1700 can include a UCB 1750. The UCB can include a plurality of DC-to-DC power converters. As described above, each DC-to-DC power converter in the plurality of DC-to-DC power converters can include a mechanical connection to a respective MPS in the plurality of MPSs. The mechanical connection between each DC-to-DC converter and a respective MPS can enable power transfer, control, and so on. The mechanical connections between the plurality of DC-to-DC converters and the plurality of MPSs can remain reliable when the DC-to-DC converters and the MPSs are operating. The mechanical connection can accommodate a maximum lateral displacement of the UCB due to thermal expansion during operation. The handling maximum lateral displacement is critical to maintaining reliable mechanical connections between and among components, the WSSI, one or more UCBs, one or more MPSs, and so on. Embodiments include a unified circuit board (UCB), wherein the UCB is mechanically connected to a plurality of modular power substrates (MPSs), wherein the UCB includes a plurality of DC-to-DC converters, and wherein the UCB sends DC power to the plurality of functional chips bonded to the WSSI, wherein the sending is based on the plurality of TSVs.

The UCB 1750 includes a digital controller chip 1760. The digital controller chip controls power delivery to the plurality of functional chips. The controlling power delivery can include enabling or disabling power transfer, controlling an input voltage to and an output voltage from a DC-to-DC converter, and the like. Recall that the MPS can include a plurality of rigid-flex strips that can accommodate lateral displacement of the UCB due to thermal expansion during operation. The rigid-flex strips can accomplish other functions. In a usage example, the plurality of rigid-flex strips can include one or more power control signals from the digital controller chip to the plurality of MPSs. The control signals can enable and disable elements such as controller chips and DC-to-DC converters, can provide instructions to controller chips, etc. In a further usage example, the plurality of rigid-flex strips can carry at least a portion of DC power from the plurality of MPSs to the plurality of functional chips.

The apparatus 1700 can include one or more solder bumps 1758. The solder bumps can be positioned on a side of the UCB opposite to the side of the UCB that includes the mechanical connections to the MPSs. The solder bumps can be placed on contacts or pads. The solder bumps can be arranged in an array pattern such as a regular array pattern. The solder bumps can be placed on fewer pads than a regular array. The apparatus 1700 can include a DC-to-DC converter 1770. The DC-to-DC converters can convert a first DC voltage to a second DC voltage. The DC-to-DC converters can be controlled by a control chip associated with the UCB. The DC-to-DC converters can be coupled to the UCB using the solder bumps. A usage example can include matching each DC-to-DC power converter within the plurality of DC-to-DC power converters included on the UCB to one or more respective MPSs in the plurality of MPSs. DC power from a DC-to-DC converter can be sent to a MPS via an interconnect on the UCB. DC power can be fed to the DC-to-DC converters.

The apparatus 1700 includes a cold plate 1780. The cold plate comprises an inlet plate 1782, a jet-plate 1784, and a fin-plate 1786. In embodiments, the inlet plate, the jet-plate and the fin-plate are comprised of copper. The cold plate is attached to the plurality of functional chips in order to transfer heat from the plurality of functional chips to a coolant. In embodiments, the attaching includes a thermal interface material (TIM) 1788. The TIM can comprise thermal tape, grease, gel, adhesive, phase change materials (PCMs), metal TIMs, pyrolytic graphite, and so on. In a usage example, the TIM can include an uncured TIM such as an uncured epoxy, a gap filler, and so on. The apparatus 1700 includes at least one inlet nozzle 1790. In embodiments, the inlet plate includes at least one inlet nozzle, wherein the inlet nozzle receives the coolant at a first temperature. The inlet nozzle receives a coolant at a first temperature. The coolant can comprise distilled water or another liquid. In embodiments, the at least one inlet nozzle is located orthogonally to a heat extraction plane within the fin-plate.

In embodiments, the jet-plate is used to spray the coolant on the fin-plate. The spraying can be accomplished by holes in the jet-plate. In embodiments, the spraying is accomplished by a plurality of holes in the jet-plate, wherein a diameter of a first hole within the plurality of holes at a first distance from the center of the jet-plate is a different size than a second hole within the plurality of holes at a second distance from the center of the jet-plate. The differences in hole sizes can be used to accommodate changing coolant pressures at various locations on the jet-plate, differences in coolant flow, differences in coolant temperature, and so on.

In embodiments, the fin-plate comprises a plurality of internal fins 1792. The internal fins can increase the surface area of the fin-plate, allowing heat to be extracted more effectively. The internal fins can include a variety of cross-sectional profiles. The cross-sectional profiles can include a square, diamond, or rectangular prefile; a round or oval profile; and so on. In embodiments, a height of each internal fin within the plurality of internal fins provides a gap 1794 to a top of the jet-plate from a bottom of the fin-plate. The gap can facilitate the coolant entering, mixing, and exiting the cold plate. At least a portion of the heat that was created is transferred, by the cold plate, to the coolant. In embodiments, the plurality of internal fins includes one or more structural pillars. In further embodiments, the structural pillars provide rigidity between the jet-plate and the fin-plate, wherein the structural pillars include mechanical connections between the jet-plate and the fin-plate.

The apparatus 1700 includes one or more outlet chambers within the jet-plate. In embodiments, the jet-plate includes one or more outlet chambers, wherein the one or more outlet chambers capture the coolant at a second temperature. The one or more outlet chambers can be accessible via one or more outlet nozzles 1796. Embodiments include capturing the coolant, at a second temperature, from one or more outlet chambers within the jet-plate. The one or more outlet chambers capture the coolant at a second temperature and route the coolant at the second temperature to the outlet nozzle. The coolant can reach the second temperature after extracting at least a portion of the heat from the cold plate. The captured coolant can be cooled to remove the heat that was transferred to the coolant by the cold plate. The heat can be removed using a variety of techniques such as using a heat exchanger. The heat exchanger can remove heat to return the coolant at the second temperature to the first temperature. In embodiments, the coolant at a first temperature is sent into at least one inlet nozzle located on the inlet plate, wherein the sending includes spraying the coolant, by the jet-plate, on the fin-plate. The sending the coolant at the first temperature, the transferring the heat, the capturing the coolant, and the extracting the heat from the coolant at the second temperature to return the coolant to the first temperature can be repeated. The heat extraction can occur at a heat extraction plane 1798. The heat extraction plane can be within the fin-plate. In embodiments, the at least one inlet nozzle is located orthogonally to a heat extraction plane within the fin-plate.

Each of the above methods may be executed on one or more processors on one or more computer systems. Embodiments may include various forms of distributed computing, client/server computing, and cloud-based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general-purpose hardware and computer instructions, and so on.

A programmable apparatus which executes any of the above-mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are limited to neither conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM); an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States, then the method is considered to be performed in the United States by virtue of the causal entity.

While the invention has been disclosed in connection with preferred embodiments shown and described in detail, various modifications and improvements thereon will become apparent to those skilled in the art. Accordingly, the foregoing examples should not limit the spirit and scope of the present invention; rather it should be understood in the broadest sense allowable by law.

What is claimed is:

1. A method for cooling comprising:
- accessing a wafer-scale silicon interposer (WSSI), wherein a front side of the WSSI is bonded to a plurality of functional chips, wherein the plurality of functional chips creates heat during operation, wherein the WSSI includes a plurality of through-silicon vias (TSVs), wherein a back side of the WSSI is coupled to a plurality of DC-to-DC power converters;
- attaching a cold plate to the plurality of functional chips, wherein the cold plate comprises an inlet plate, a jet-plate, and a fin-plate;
- sending a coolant at a first temperature into at least one inlet nozzle located on the inlet plate, wherein the sending includes spraying the coolant, by the jet-plate, on the fin-plate;
- transferring at least a portion of the heat that was created, by the cold plate, to the coolant that was sent; and
- capturing the coolant, at a second temperature, from one or more outlet chambers within the jet-plate.

2. The method of claim 1 wherein the inlet nozzle within the inlet plate is orthogonal to a heat extraction plane within the fin-plate.

3. The method of claim 1 wherein the spraying occurs at a location on the fin-plate corresponding to each functional chip within the plurality of functional chips.

4. The method of claim 1 wherein the fin-plate comprises a plurality of internal fins.

5. The method of claim 4 wherein the plurality of internal fins includes one or more structural pillars.

6. The method of claim 5 wherein the structural pillars provide rigidity between the jet-plate and the fin-plate, wherein the structural pillars include mechanical connections between the jet-plate and the fin-plate.

7. The method of claim 5 wherein the one or more structural pillars are comprised of copper.

8. The method of claim 4 wherein the jet-plate and the fin-plate are mechanically connected.

9. The method of claim 8 wherein a height of each internal fin within the plurality of internal fins provides a gap to a top of the jet-plate from a bottom of the fin-plate.

10. The method of claim 1 further comprising attaching, to the back side of the WSSI, a plurality of modular power substrates (MPSs), wherein each MPS is coupled to a corresponding functional chip within the plurality of functional chips.

11. The method of claim 10 wherein the plurality of MPSs is based on a form factor mirroring the corresponding functional chip.

12. The method of claim 10 further comprising connecting mechanically the plurality of MPSs, to a unified control board (UCB), wherein the UCB includes the plurality of DC-to-DC power converters.

13. The method of claim 12 further comprising delivering DC power, by the UCB, to the plurality of MPSs, wherein the delivering includes a first voltage conversion.

14. The method of claim 13 further comprising transferring the DC power that was delivered, by the plurality of MPSs, to the plurality of functional chips, wherein the transferring includes a second voltage conversion, and wherein the transferring is based on the plurality of TSVs.

15. The method of claim 1 wherein the attaching includes a thermal interface material (TIM).

16. The method of claim 1 wherein the inlet plate, the jet-plate, and the fin-plate are comprised of copper.

17. The method of claim 1 wherein the plurality of functional chips includes one or more artificial intelligence accelerators.

18. The method of claim 1 wherein the plurality of functional chips includes one or more memory devices.

19. The method of claim 1 further comprising mounting the cold plate to an isometric grid array (IGA), wherein the IGA provides stiffening for the WSSI.

20. The method of claim 19 wherein the mounting is based on one or more spring-loaded fasteners.

21. An apparatus for cooling comprising:
- a wafer-scale silicon interposer (WSSI), wherein a front side of the WSSI is bonded to a plurality of functional chips, wherein the plurality of functional chips creates heat during operation, and wherein the WSSI includes a plurality of through-silicon vias (TSVs), wherein a back side of the WSSI is coupled to a plurality of DC-to-DC power converters;
- a cold plate, wherein the cold plate comprises an inlet plate, a jet-plate, and a fin-plate;
- at least one inlet nozzle located on the inlet plate, wherein the inlet nozzle receives a coolant at a first temperature, and wherein the jet-plate is used to spray the coolant that was received on the fin-plate, and wherein at least a portion of the heat that was created is transferred, by the cold plate, to the coolant that was sent; and one or more outlet chambers within the jet-plate, wherein the one or more outlet chambers capture the coolant at a second temperature.

22. The apparatus of claim 21 wherein the inlet plate includes at least one inlet nozzle, wherein the inlet nozzle receives the coolant at the first temperature.

23. The apparatus of claim 22 wherein the at least one inlet nozzle is located orthogonally to a heat extraction plane within the fin-plate.

24. The apparatus of claim 21 wherein the jet-plate is used to spray the coolant on the fin-plate.

25. The apparatus of claim 24 wherein the fin-plate comprises a plurality of internal fins.

26. The apparatus of claim 25 wherein the plurality of internal fins includes one or more structural pillars.

27. The apparatus of claim 21 wherein the jet-plate includes one or more outlet chambers, wherein the one or more outlet chambers capture the coolant at the second temperature.

28. The apparatus of claim 21 further comprising a plurality of modular power substrates (MPSs), wherein the plurality of MPSs is attached to a back side of the WSSI.

29. The apparatus of claim 21 further comprising a unified circuit board (UCB), wherein the UCB is mechanically connected to a plurality of modular power substrates (MPSs), wherein the UCB includes a plurality of DC-to-DC converters, and wherein the UCB sends DC power to the plurality of functional chips bonded to the WSSI, wherein the sending is based on the plurality of TSVs.

30. A system for cooling comprising:

a wafer-scale silicon interposer (WSSI), wherein a front side of the WSSI is bonded to a plurality of functional chips, wherein the plurality of functional chips create heat during operation, wherein the WSSI includes a plurality of through-silicon vias (TSVs), and wherein a back side of the WSSI is coupled to a plurality of DC-to-DC power converters;

a cold plate, wherein the cold plate comprises an inlet plate, a jet-plate, and a fin-plate, wherein the inlet plate includes at least one inlet nozzle, wherein the jet-plate includes one or more outlet chambers, wherein the system, when supplied with a coolant at a first temperature, is configured to:

send the coolant at a first temperature into the at least one inlet nozzle located on the inlet plate;

spray the coolant, by the jet-plate, on the fin-plate;

transfer at least a portion of the heat that was created, by the cold plate, to the coolant that was sent; and capture the coolant, at a second temperature, from the one or more outlet chambers within the jet-plate.

* * * * *